United States Patent
Lim et al.

(10) Patent No.: US 7,629,219 B2
(45) Date of Patent: Dec. 8, 2009

(54) METHOD OF FABRICATING A DUAL POLYSILICON GATE OF A SEMICONDUCTOR DEVICE WITH A MULTI-PLANE CHANNEL

(75) Inventors: Kwan-Yong Lim, Ichon-shi (KR); Heung-Jae Cho, Ichon-shi (KR); Min-Gyu Sung, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 269 days.

(21) Appl. No.: 11/618,779

(22) Filed: Dec. 30, 2006

(65) Prior Publication Data

US 2008/0081421 A1 Apr. 3, 2008

(30) Foreign Application Priority Data

Oct. 2, 2006 (KR) ........................ 10-2006-0097296

(51) Int. Cl.
*H01L 21/336* (2006.01)
(52) U.S. Cl. ................... 438/270; 438/176; 438/197; 438/259; 438/585; 257/365; 257/E21.197; 257/E21.429
(58) Field of Classification Search ................ 257/365, 257/330, 369, 396, E21.15, E21.197, E21.429; 438/270, 259, 176, 197, 589
See application file for complete search history.

(56) References Cited

U.S. PATENT DOCUMENTS

| 4,507,849 | A | * | 4/1985 | Shinozaki | 438/430 |
|---|---|---|---|---|---|
| 4,693,782 | A | * | 9/1987 | Kikuchi et al. | 438/365 |
| 4,835,597 | A | * | 5/1989 | Okuyama et al. | 257/634 |
| 5,086,007 | A | * | 2/1992 | Ueno | 438/138 |
| 6,242,300 | B1 | * | 6/2001 | Wang | 438/241 |
| 6,387,743 | B1 | * | 5/2002 | Shiozawa et al. | 438/199 |
| 2004/0070007 | A1 | * | 4/2004 | Zhang | 257/200 |
| 2004/0173844 | A1 | * | 9/2004 | Williams et al. | 257/329 |
| 2004/0183129 | A1 | * | 9/2004 | Williams et al. | 257/330 |
| 2005/0014338 | A1 | * | 1/2005 | Kim et al. | 438/275 |
| 2005/0037559 | A1 | * | 2/2005 | Osanai | 438/199 |
| 2006/0138550 | A1 | * | 6/2006 | Cho et al. | 257/369 |
| 2006/0189085 | A1 | * | 8/2006 | Kim et al. | 438/283 |
| 2006/0270154 | A1 | * | 11/2006 | Yamazaki | 438/253 |
| 2007/0077713 | A1 | * | 4/2007 | Ha et al. | 438/270 |

FOREIGN PATENT DOCUMENTS

KR 1020050027525 A 3/2005
KR 1020060013033 A 2/2006

* cited by examiner

*Primary Examiner*—Bradley K Smith
*Assistant Examiner*—Duy T Nguyen
(74) *Attorney, Agent, or Firm*—Townsend and Townsend and Crew LLP

(57) ABSTRACT

A dual polysilicon gate of a semiconductor device includes a substrate having a first region, a second region, and a third region, a channel region with a recessed structure formed in the first region of the substrate, a gate insulating layer formed over the substrate, a first polysilicon layer filled into the channel region, and formed over the gate insulating layer of the first and second regions, a second polysilicon layer formed over the gate insulating layer of the third region, and an insulating layer doped with an impurity, and disposed inside the first polysilicon layer in the channel region.

24 Claims, 26 Drawing Sheets

CELL ARRAY REGION   PERI NMOS   PERI PMOS

CELL ARRAY REGION   PERI NMOS   PERI PMOS

METHOD OF FABRICATING A DUAL POLYSILICON GATE OF A SEMICONDUCTOR DEVICE WITH A MULTI-PLANE CHANNEL

CROSS-REFERENCE TO RELATED APPLICATIONS

The present invention claims priority of Korean patent application number 10-2006-0097296, filed on Oct. 2, 2006, which is incorporated by reference in its entirety.

BACKGROUND OF THE INVENTION

The present invention relates to a fabrication method of a semiconductor device, and more particularly to a dual polysilicon gate of a semiconductor device having a three-dimensional multi-plane channel and a fabrication method thereof.

With the increase in the scale of integration of a semiconductor device, there is a need for a sub-100 nm memory array transistor. The sub-100 nm transistor has very low threshold voltage due to the short channel effect, and thus the retention time is drastically decreased.

To solve the above limitation, a recessed channel array transistor (RCAT) has been developed. This RCAT has a long retention time because the channel length is longer than that of a typical planar type transistor.

In recent years, a dual polysilicon gate (DPG) process is being used for improving on/off-current characteristics (Ion/Ioff) of a logic device as well as retention characteristics from those of the RCAT. Particularly, in a device having a 3-dimensional memory cell transistor such as an RCAT, when employing a typical dual ion implantation where phosphorous (P) and boron (B) ions are implanted into NMOS and PMOS transistors, respectively, the doping concentration in the polysilicon under the recessed channel is too small, and this fact causes polysilicon depletion to occur. Therefore, the DPG process is used so that polysilicon doped with low concentration phosphorous is deposited, and thereafter boron ions with very high dose (e.g., beyond $1E16/cm^2$) are implanted into the PMOS region. Herein, such an implantation is so called a converted DPG or a counter doping.

FIGS. 1A to 1C illustrate a typical method of forming a dual polysilicon gate.

Referring to FIG. 1A, a device isolation structure 12 is formed in a substrate 11 where a cell array region and a peripheral circuit region are defined. Here, the peripheral circuit region includes a peripheral NMOS region and a peripheral PMOS region. A hard mask layer is formed on the resultant structure, and patterned to form a hard mask pattern 13 defining a recessed channel region in the cell array region. The substrate 11 of the cell array region is etched using the hard mask pattern 13 as an etch barrier to thereby form a recessed channel region 14 in a trench shape.

Referring to FIG. 1B, the hard mask pattern 13 is removed. After forming a gate insulating layer 15 on the resultant structure, a phosphorous-doped N+ polysilicon layer 16A is deposited on the gate insulating layer 15 until it fills the recessed channel region 14. A photoresist layer 17 is formed covering the cell array region and the peripheral NMOS region. Boron (B) ions 18 are implanted into the N+ polysilicon layer 16A of the exposed peripheral PMOS region to form a P+ polysilicon layer 16B.

Referring to FIG. 1C, after the photoresist layer 17 is removed, a high-temperature thermal treatment 19 is performed to form the phosphorous-doped N+ polysilicon layer 16A in the cell array region and the peripheral NMOS region, and form the boron-doped P+ polysilicon layer 16B in the peripheral PMOS region. However, when doping boron ions according to the typical method, a very high dose boron ion implantation is required (e.g., beyond $1E16/cm^2$) because the heavily doped P+ polysilicon layer 16B should be formed by implanting boron ions into the phosphorous-doped N+ polysilicon layer 16A.

When forming the P+ polysilicon layer 16B by implanting high-dose boron ions, the curing of the photoresist layer 17 used in the ion implantation is intensified. As a result, it is difficult to strip the photoresist layer in a following process. Accordingly, this difficulty causes residue from the photoresist layer to remain even after the cleaning process, and on top of that the residue reacts with the metallic material deposited on the polysilicon layer.

SUMMARY OF THE INVENTION

Embodiments of the present invention are directed towards providing a method for forming a dual polysilicon gate of a semiconductor device having a multi-plane channel capable of forming a dual polysilicon gate with low dose ion implantation.

In accordance with an aspect of the present invention, there is provided a dual polysilicon gate of a semiconductor device, including: a substrate including a first region, a second region, and a third region; a channel region with a recessed structure formed in the first region of the substrate; a gate insulating layer formed over the substrate; a first polysilicon layer filled into the channel region, and formed over the gate insulating layer of the first and second regions; a second polysilicon layer formed over the gate insulating layer of the third region; and an insulating layer doped with an impurity, and disposed inside the first polysilicon layer in the channel region.

In accordance with another aspect of the present invention, there is provided a method for forming a dual polysilicon gate of a semiconductor device, the method including: forming a channel region with a recessed structure in a first region of a substrate having the first region and a second region; forming a gate insulating layer over the substrate; forming a first polysilicon layer over the gate insulating layer; forming an insulating layer doped with a first impurity over the first polysilicon layer of the first region; diffusing the first impurity of the insulating layer into the first polysilicon layer of the first region through a first thermal treatment; leaving the insulating layer remaining over the first polysilicon layer inside the channel region; forming a second polysilicon layer over the insulating layer and the first polysilicon layer; implanting a second impurity into the second polysilicon layer of the second region; and forming a polysilicon layer doped with the first impurity in the first region, and simultaneously forming a polysilicon layer doped with the second impurity in the second region through a second thermal treatment.

In accordance with still another aspect of the present invention, there is provided a dual polysilicon gate of a semiconductor device, including: a substrate including a first region, a second region, and a third region; a channel region with a protrusion structure formed in the substrate of the first region; a gate insulating layer formed over the substrate; a first polysilicon layer filled into the channel region, and formed over the gate insulating layer of the first and second regions; a second polysilicon layer formed over the gate insulating layer of the third region; and an insulating layer doped with an impurity, and disposed inside the first polysilicon layer in the channel region.

In accordance with yet another aspect of the present invention, there is provided a method for forming a dual polysilicon gate of a semiconductor device, the method including: forming a channel region with a protrusion structure in a first region of a substrate having the first region and a second region; forming a gate insulating layer over the substrate; forming a first polysilicon layer over the gate insulating layer; forming an insulating layer doped with a first impurity over the first polysilicon layer of the first region; diffusing the first impurity of the insulating layer into the first polysilicon layer of the first region through a first thermal treatment; leaving the insulating layer remaining over the first polysilicon layer outside the channel region; forming a second polysilicon layer over the insulating layer and the first polysilicon layer; implanting a second impurity into the second polysilicon layer of the second region; and forming a polysilicon layer doped with the first impurity in the first region, and simultaneously forming a polysilicon layer doped with the second impurity in the second region through a second thermal treatment.

BRIEF DESCRIPTION OF THE DRAWINGS

FIGS. 3A to 3I illustrate a method of forming the dual polysilicon gate in accordance with the first embodiment of the present invention.

FIGS. 5A to 5I illustrate a method of forming the dual polysilicon gate in accordance with the second embodiment of the present invention.

DESCRIPTION OF SPECIFIC EMBODIMENTS

The following embodiments relate to a method of forming a dual polysilicon gate of a semiconductor device having a multi-plane channel. In these embodiments multi-plane channel structured transistors such as a recessed channel array transistor (RCAT), a bulb-type recess channel array transistor, a fin-like field effect transistor (FinFET), or a saddle FinFET are formed in a cell array region, and planar transistors are formed in a peripheral circuit region.

Figure 1A:
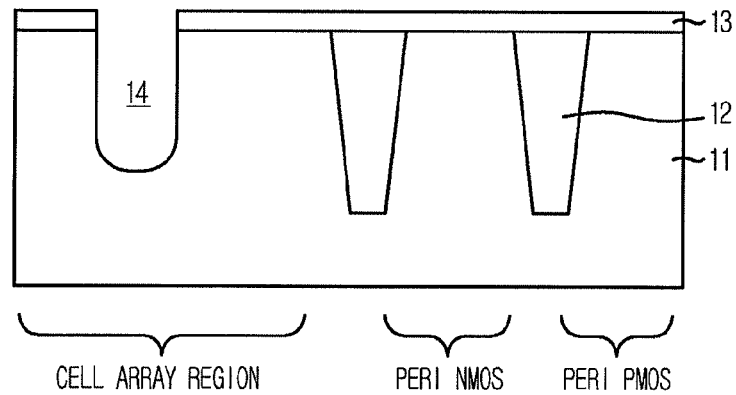
FIGS. 1A to 1C illustrate a typical method of forming a dual polysilicon gate.
Figure 1B:
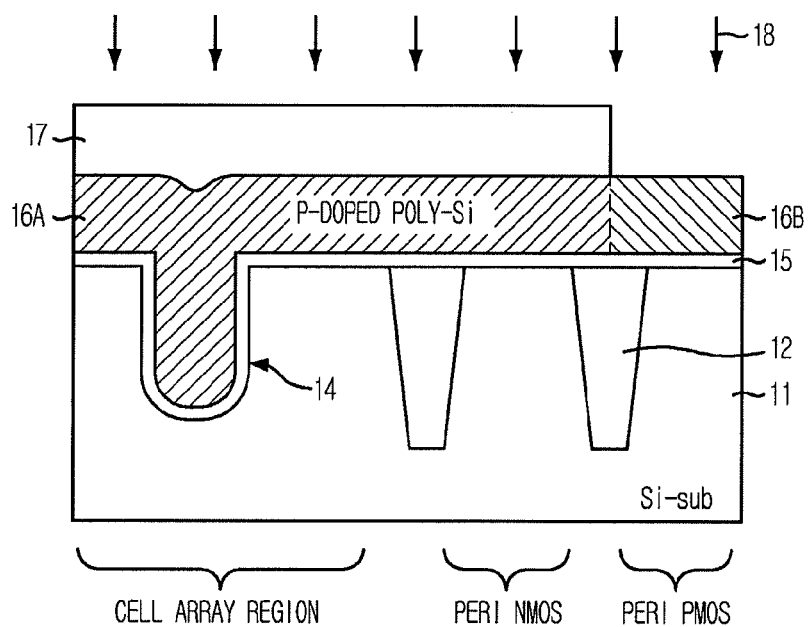
Figure 1C:
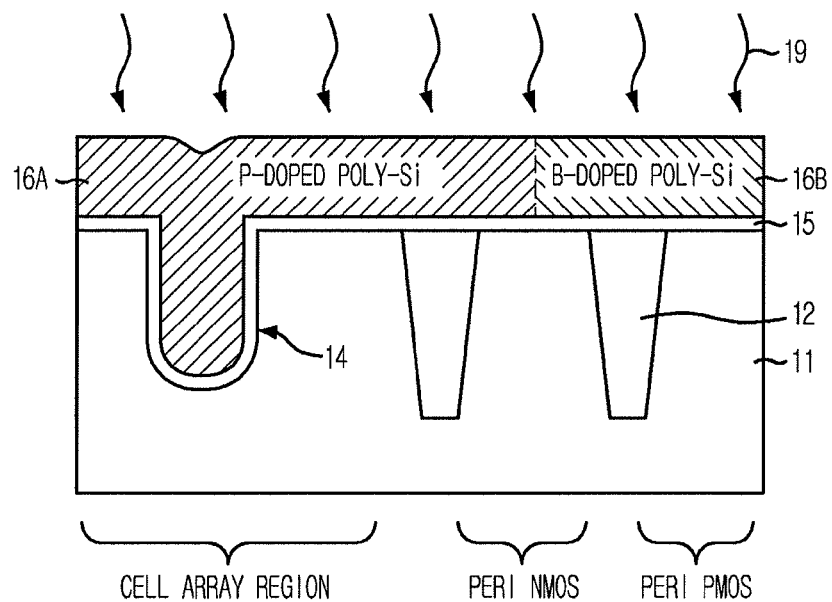
Figure 2:
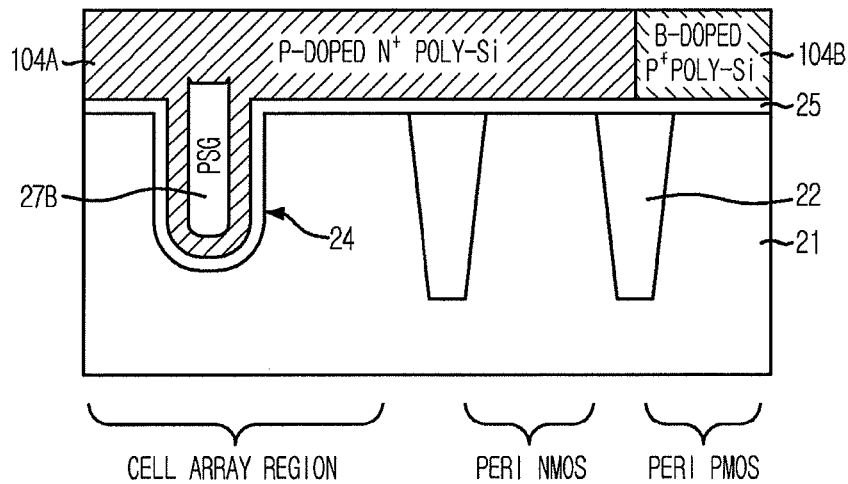
FIG. 2 illustrates a cross-sectional view of a semiconductor device having a dual polysilicon gate in accordance with a first embodiment of the present invention.

FIG. 2 illustrates a cross-sectional view of a semiconductor device having a dual polysilicon gate in accordance with a first embodiment of the present invention. In the semiconductor device of the first embodiment, an RCAT is formed in a cell array region, and a planar transistor is formed in a peripheral circuit region.

As illustrated, a device isolation structure 22 is formed for isolating regions in a substrate 21 where a cell array region, a peripheral NMOS region, and a peripheral PMOS region are defined. Here, NMOSFETs are formed in the cell array region and the peripheral NMOS region, and PMOSFETs are formed in the peripheral PMOS region.

A recessed channel region 24 having a trench shape is formed in the substrate 21 of the cell array region, and a gate insulating layer 25 is then formed on a surface of the substrate 21 including the recessed channel region 24. Herein, both sidewalls and the bottom surface of the recessed channel region 24 act as channels so that the recessed channel region 24 provides a multi-plane channel. The gate insulating layer 25 includes at least one selected from the group consisting of a silicon oxide ($SiO_2$) layer, a silicon oxynitride (SiON) layer, a silicon nitride ($Si_3N_4$) layer, a hafnium silicate layer and a hafnium silioxynitride (Hf—Si—O—N) layer.

An N+ polysilicon layer 104A filling the recessed channel region 24 is formed over the cell array region and the peripheral NMOS region. A P+ polysilicon layer 104B is formed over the peripheral PMOS region. Here, the N+ polysilicon layer 104A is a phosphorous (P) heavily doped (N+) polysilicon layer (hereinafter, referred to as P-doped N+ polysilicon layer), and the P+ polysilicon layer 104B is a boron-heavily doped (P+) polysilicon layer (hereinafter, referred to as B-doped P+ polysilicon layer).

Inside the N+ polysilicon layer 104A in the recessed channel region 24, a phosphorous silicate glass (PSG) pattern 27B is formed. Herein, the PSG pattern 27B is an insulating layer doped with phosphorous, and has a phosphorous concentration ranging from approximately 1% to approximately 20%.

In the first embodiment, a gate electrode is formed from the P-doped N+ polysilicon layer 104A in both the cell array region and the peripheral NMOS region, and a gate electrode is formed from the B-doped P+ polysilicon layer 104B in the peripheral PMOS transistor, which makes up a dual polysilicon gate (DPG) structure. The phosphorous and boron ions with doses of at most $1E16/cm^2$ are implanted into the P-doped N+ polysilicon layer 104A and the B-doped P+ polysilicon layer 104B, respectively.

Figure 3A:
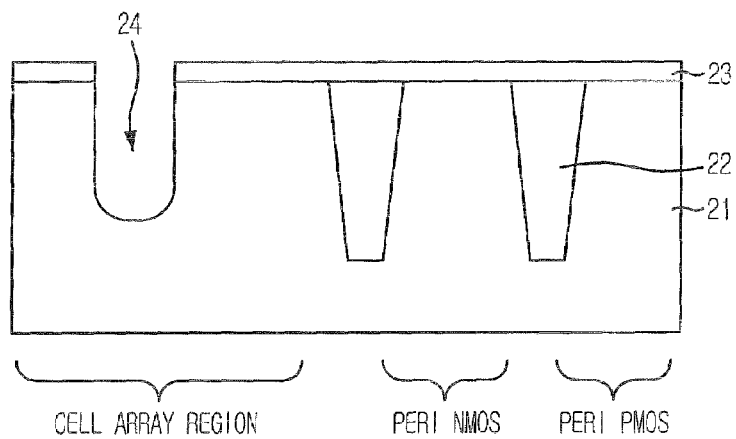

FIGS. 3A to 3I illustrate a method of forming the dual polysilicon gate in accordance with the first embodiment of the present invention. Referring to FIG. 3A, a device isolation structure 22 is formed in a substrate 21 where a cell array region, a peripheral NMOS region and a peripheral PMOS region are defined. Here, NMOSFETs are formed in the cell array region and the peripheral NMOS region, and PMOSFETs are formed in the peripheral PMOS region. The device isolation structure 22 is formed by a typical shallow trench isolation (STI) process.

After forming a hard mask layer on the resultant structure, the hard mask layer is patterned to form a hard mask pattern 23 defining a recessed channel region in the substrate 21 of the cell array region. Here, the hard mask layer is formed of a dielectric material such as silicon oxide ($SiO_2$).

The substrate 21 of the cell array region is etched using the hard mask pattern 23 as an etch barrier to form a recessed channel region 24 having a trench shape. Both sidewalls and the bottom surface of the recessed channel region 24 act as channels so that the recessed channel region 24 provides a multi-plane channel.

Figure 3B:
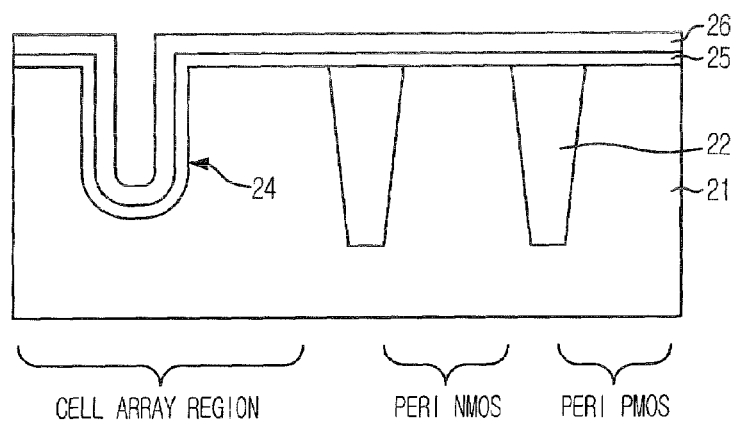

Referring to FIG. 3B, the hard mask pattern 23 is removed. Specifically, the hard mask pattern 23 is removed by wet cleaning process using buffered oxide etchant (BOE) or hydrofluoric acid (HF) solution because the hard mask is formed of silicon oxide. Herein, the BOE solution is a solution in which $NH_4F$ and HF are mixed.

A gate insulating layer 25 is formed on the resultant structure including the recessed channel region 24. The gate insulating layer 25 includes at least one selected from the group consisting of a silicon oxide ($SiO_2$) layer, a silicon oxynitride (SiON) layer, a silicon nitride ($Si_3N_4$) layer, a hafnium silicate layer and a hafnium silioxynitride (Hf—Si—O—N) layer.

A first undoped polysilicon layer 26, which is not doped with impurities, is deposited on the gate insulating layer 25. In detail, the first undoped polysilicon layer 26 is conformally deposited on the gate insulating layer 25, wherein the thickness of the first undoped polysilicon layer 26 should be smaller than half the width of the recessed channel region 24. The first undoped polysilicon layer 26 may be deposited to a thickness ranging from approximately 30 Å to approximately 500 Å at a deposition temperature ranging from approximately 450° C. to approximately 650° C.

Figure 3C:
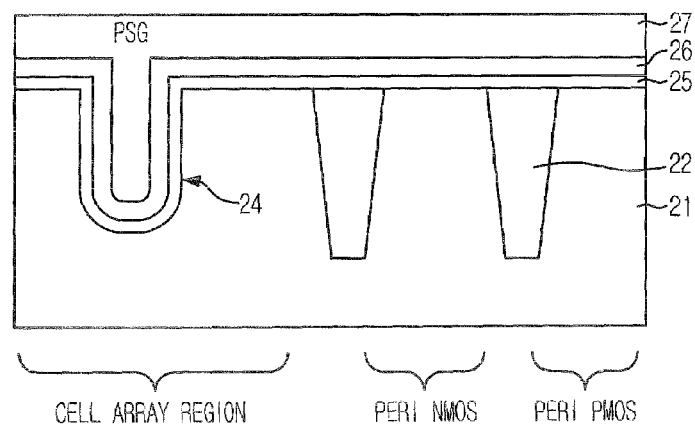

Referring to FIG. 3C, a phosphorous-doped insulating layer 27 (e.g., a PSG layer 27) is formed over the first undoped polysilicon layer 26. In the PSG layer 27, the phosphorous concentration is in the range of approximately 1% to approximately 20%.

Figure 3D:
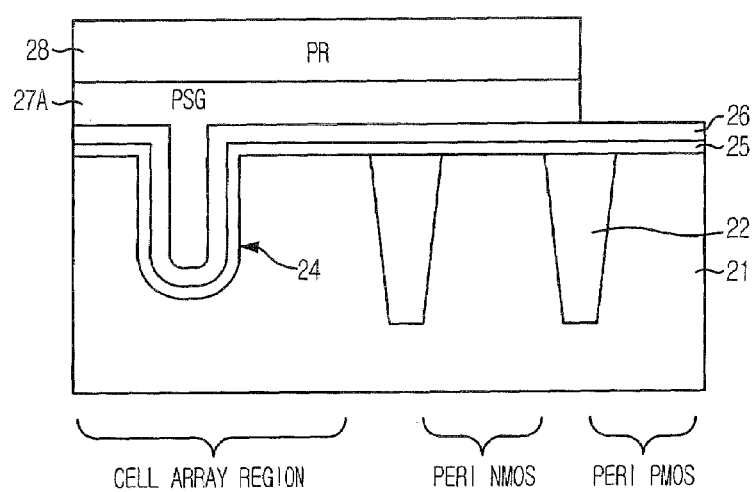

Referring to FIG. 3D, a photomask process is performed on the PSG layer 27 to form a first photoresist pattern 28 exposing the peripheral PMOS region. Whereas, the cell array region and the peripheral NMOS region are still covered with the PSG layer 27.

The PSG layer 27 of the peripheral PMOS region exposed by the first photoresist pattern 28 is selectively etched. The PSG layer 27 is etched by a dry-etching or wet-etching process, and thus a residual PSG layer 27A is left only over the cell array region and the peripheral NMOS region.

Figure 3E:
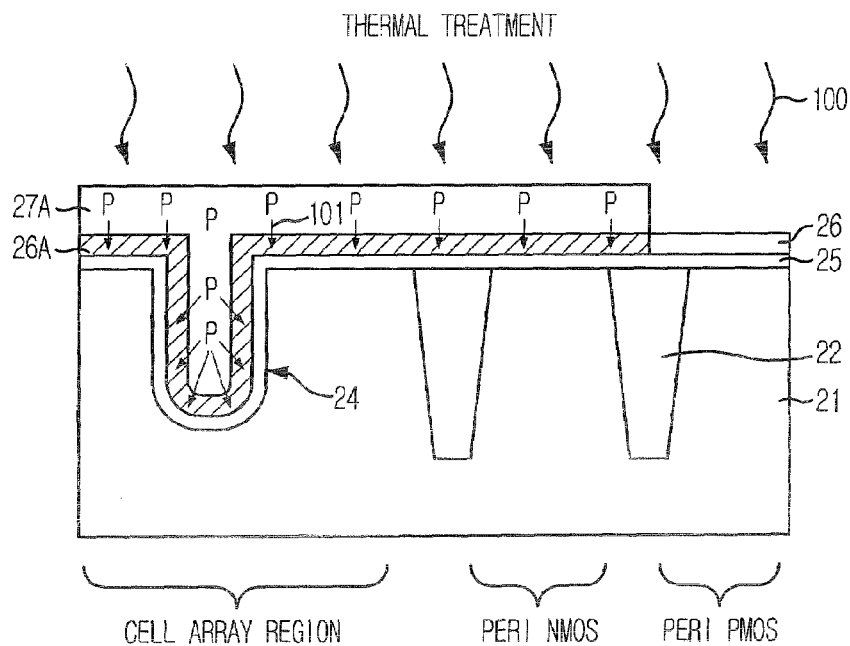

Referring to FIG. 3E, the first photoresist pattern 28 is removed. A first high-temperature thermal treatment 100 is performed to diffuse impurities (i.e., phosphorous, see reference symbol P in FIG. 3E) existing in the residual PSG layer 27A into the first undoped polysilicon layer 26. Here, a reference numeral 101 denotes the diffusion direction of the phosphorous.

As a result, the first undoped polysilicon layer 26 of the cell array region and the peripheral NMOS region is converted into a phosphorous (P) doped polysilicon layer 26A. On the contrary, the first undoped polysilicon layer 26 still remains over the peripheral PMOS region as it is not being doped with phosphorous. Therefore, an interface between the P-doped polysilicon layer 26A and the first undoped polysilicon layer 26 is formed over the device isolation structure 22 disposed between the peripheral NMOS region and the peripheral PMOS region.

The first high-temperature thermal treatment 100 for phosphorous diffusion is performed at a temperature ranging from approximately 600° C. to approximately 1,000° C. for approximately 10 seconds to approximately 60 minutes such that the phosphorous sufficiently diffuses into the first undoped polysilicon layer 26 inside the recessed channel region 24. In addition, since the residual PSG layer 27A is formed on the first undoped polysilicon layer 26 inside the recessed channel region 24, phosphorous sufficiently diffuses around the bottom of the recessed channel region 24.

Figure 3F:
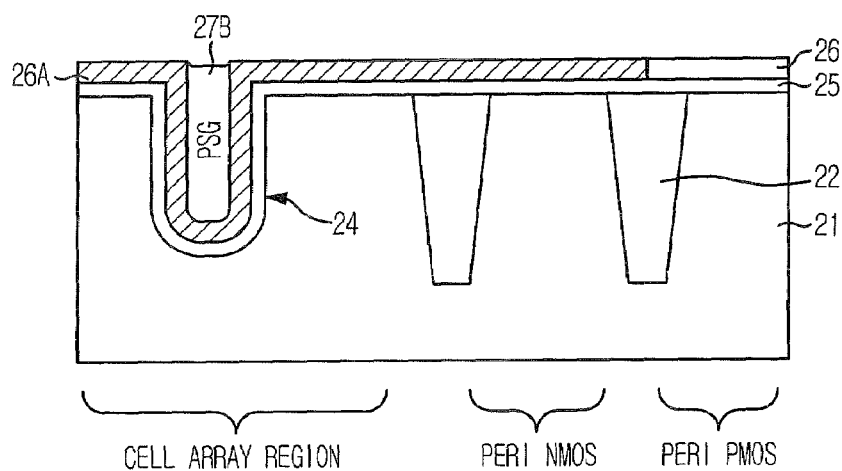

Referring to FIG. 3F, a portion of the residual PSG layer 27A which is higher than the P-doped polysilicon layer 26A is removed through a dry-etching or wet-etching process to expose the P-doped polysilicon layer 26A so that a PSG pattern 27B only remains inside the recessed channel region of the cell array region. Herein, the wet-etching process is performed using a chemical containing HF, and the dry-etching process is performed using a mixed gas of $CF_4$ and $O_2$.

Thus, the PSG pattern 27B has a shape that fills the recessed channel region 24 of the cell array region. The PSG pattern 27B will play a role in preventing a gap-fill failure when depositing a second undoped polysilicon layer.

Figure 3G:
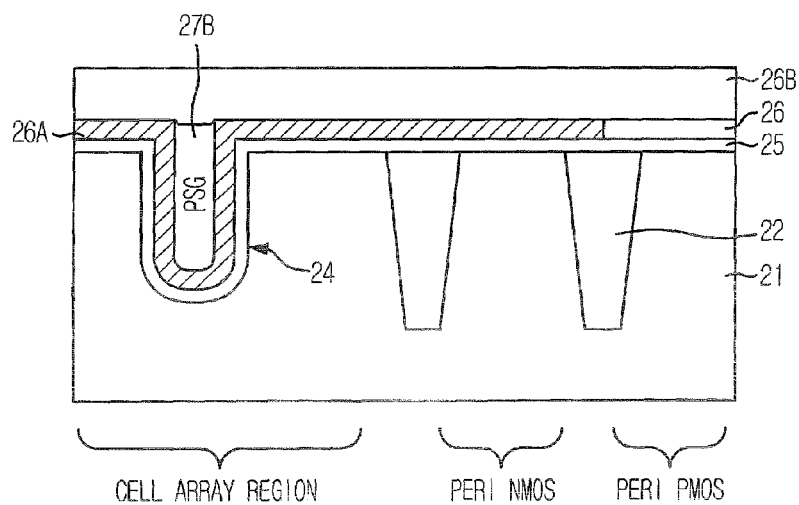

Referring to FIG. 3G, a second undoped polysilicon layer 26B is formed on the resultant structure including the PSG pattern 27B and the P-doped polysilicon layer 26A. The second undoped polysilicon layer 26B is deposited to a thickness ranging from approximately 100 Å to approximately 2,000 Å at a deposition temperature ranging from approximately 450° C. to approximately 650° C. By depositing the second undoped polysilicon layer 26B, the PSG pattern 27B has a shape that fills the inner space formed by the P-doped polysilicon layer 26A and the second undoped polysilicon layer 26B.

Figure 3H:
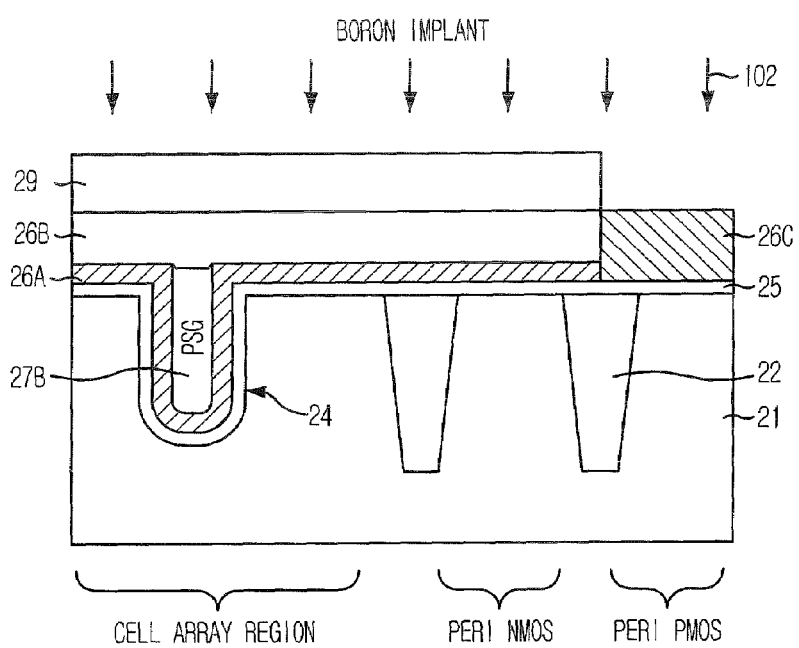
Figure 31:
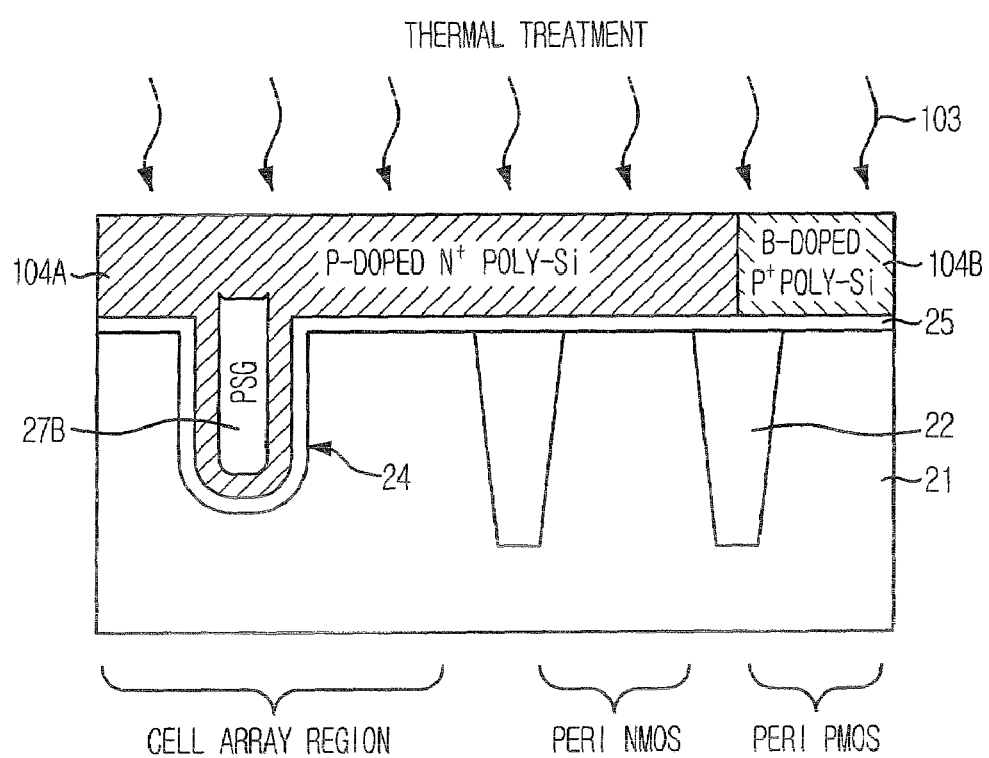

Referring to FIG. 3H, a photomask process is performed to form a second photoresist pattern 29 selectively exposing the second undoped polysilicon layer 26B of the peripheral PMOS region.

A boron ion implantation 102 is performed on only the second undoped polysilicon layer 26B of the peripheral PMOS region. Thus, the second undoped polysilicon layer 26B of the peripheral PMOS region and the first undoped polysilicon layer 26 are converted into a boron (B) doped polysilicon layer 26C. However, the second undoped polysilicon layer 26B in the cell array region and the peripheral NMOS region is left intact.

Herein, a dose of the boron ion implantation is at most $1E16/cm^2$. In particular, the dose of the boron ion implantation may range from approximately $3E15/cm^2$ to approximately $1E16/cm^2$. Since the boron ion implantation is performed only on the second undoped polysilicon layer 26B which is not doped with any dopant, it is unnecessary to perform a counter-doping, which is significantly different from the typical method. Therefore, it is possible to implant high concentration boron ions in spite of low doses ranging from approximately $3E15/cm^2$ to approximately $1E16/cm^2$, which provides an advantageous effect of preventing the second photoresist pattern 29 from being cured.

Meanwhile, boron ions are also implanted into the first undoped polysilicon layer 26 which remains over the peripheral PMOS region as it is not being doped with phosphorous.

Referring to FIG. 3I, the second photoresist pattern 29 is removed and a second high-temperature thermal treatment 103 is then performed to form an N+ polysilicon layer 104A in the cell array region and the peripheral NMOS region, and form a P+ polysilicon layer 104B in the peripheral PMOS region. The second high-temperature thermal treatment 103 may be performed at a temperature ranging from approximately 600° C. to approximately 1,000° C. for approximately 10 seconds to approximately 60 minutes.

In detail, by means of the second high-temperature thermal treatment 103, the phosphorous in the PSG pattern 27B and the P-doped polysilicon layer 26A diffuses into the second undoped polysilicon layer 26B evenly thereby forming the N+ polysilicon layer 104A uniformly doped with phosphorous in the cell array region and the peripheral NMOS region. Also, by means of the second high-temperature thermal treatment 103, the boron in the B-doped polysilicon layer 26C and the first undoped polysilicon layer 26 diffuses evenly thereby forming the P+ polysilicon layer 104B uniformly doped with boron in the peripheral PMOS region. The phosphorous and boron ions are implanted into the N+ polysilicon layer 104A and the P+ polysilicon layer 104B with a dose of at most 1E16/cm².

Through the above process, the P-doped N+ polysilicon layer 104A is formed in the cell array region and the peripheral NMOS region, and simultaneously the B-doped P+ polysilicon layer 104B is formed in the peripheral PMOS region, whereby a dual polysilicon gate structure is obtained.

Although the PSG pattern 27B exists inside the P-doped N+ polysilicon, the PSG pattern 27B is disposed inside the recessed channel region 24 so that the PSG pattern 27B does not have an effect on the device characteristics.

Figure 4:
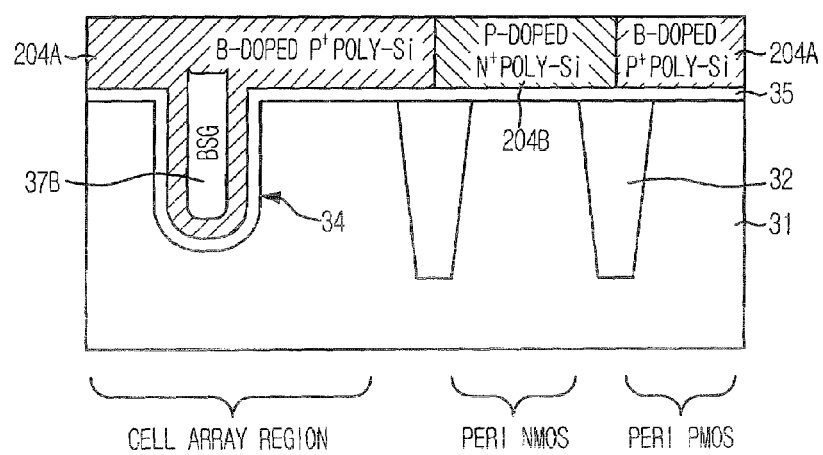
FIG. 4 illustrates a cross-sectional view of a semiconductor device having a dual polysilicon gate in accordance with a second embodiment of the present invention.

FIG. 4 illustrates a cross-sectional view of a semiconductor device having a dual polysilicon gate in accordance with a second embodiment of the present invention. In the semiconductor device of the second embodiment, a RCAT is formed in a cell array region, and a planar transistor is formed in a peripheral circuit region.

As illustrated, a device isolation structure 32 is formed for isolating respective regions in a substrate 31 where a cell array region, a peripheral NMOS region, and a peripheral PMOS region are defined. Here, NMOSFETs are formed in the cell array region and the peripheral NMOS region, and PMOSFETs are formed in the peripheral PMOS region.

A recessed channel region 34 having a trench shape is formed in the substrate 31 of the cell array region, and a gate insulating layer 35 is then formed on a surface of the substrate 31 including the recessed channel region 34. Herein, both sidewalls and the bottom surface of the recessed channel region 34 act as channels so that the recessed channel region 34 provides a multi-plane channel. The gate insulating layer 35 includes at least one selected from the group consisting of a silicon oxide ($SiO_2$) layer, a silicon oxynitride (SiON) layer, a silicon nitride ($Si_3N_4$) layer, a hafnium silicate layer and a hafnium silioxynitride (Hf—Si—O—N) layer.

A P+ polysilicon layer 204A filling the recessed channel region 34 is formed over the cell array region and the peripheral PMOS region. An N+ polysilicon layer 204B is formed over the peripheral NMOS region. Here, the N+ polysilicon layer 204B is a phosphorous (P) heavily doped (N+) polysilicon layer (P-doped N+ polysilicon layer), and the P+ polysilicon layer 204A is a boron-heavily doped (P+) polysilicon layer (B-doped P+ polysilicon layer).

Inside the P+ polysilicon layer 204A in the recessed channel region 34, a boron silicate glass (BSG) pattern 37B is formed. Herein, the BSG pattern 37B is an insulating layer doped with boron, and has a boron concentration ranging from approximately 1% to approximately 20%.

In the second embodiment, a gate electrode is formed from the B-doped P+ polysilicon layer 204A in both the cell array region and the peripheral PMOS region, and a gate electrode is formed from the P-doped N+ polysilicon layer 204B in the peripheral NMOS transistor, which makes up a dual polysilicon gate (DPG) structure. The phosphorous and boron ions with doses of at most 1E16/cm² are implanted into the P-doped N+ polysilicon layer 204B and the B-doped P+ polysilicon layer 204A, respectively.

Consequently, when the B-doped P+ polysilicon layer 204A is used as the gate electrode of the cell region, the threshold voltage rises because the boron concentration is uniform at every position, which makes it possible to prevent an off-leakage characteristic from being degraded.

Figure 5A:
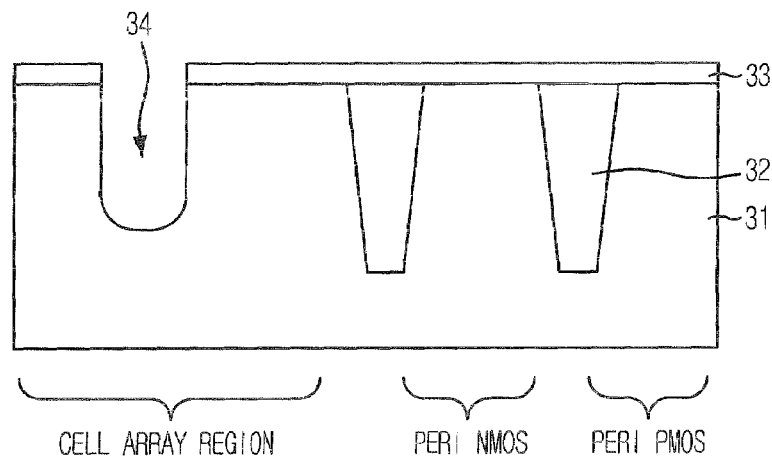

FIGS. 5A to 5I illustrate a method of forming the dual polysilicon gate in accordance with the second embodiment of the present invention. Referring to FIG. 5A, a device isolation structure 32 is formed in a substrate 31 where a cell array region, a peripheral NMOS region and a peripheral PMOS region are defined. Here, NMOSFETs are formed in the cell array region and the peripheral NMOS region, and PMOSFETs are formed in the peripheral PMOS region. The device isolation structure 32 is formed by a typical shallow trench isolation (STI) process.

After forming a hard mask layer on the resultant structure, the hard mask layer is patterned to form a hard mask pattern 33 defining a recessed channel region in the substrate 31 of the cell array region. Here, the hard mask layer is formed of a dielectric material such as silicon oxide ($SiO_2$).

The substrate 31 of the cell array region is etched using the hard mask pattern 33 as an etch barrier to form a recessed channel region 34 having a trench shape. Both sidewalls and the bottom surface of the recessed channel region 34 act as channels so that the recessed channel region 34 provides a multi-plane channel.

Figure 5B:
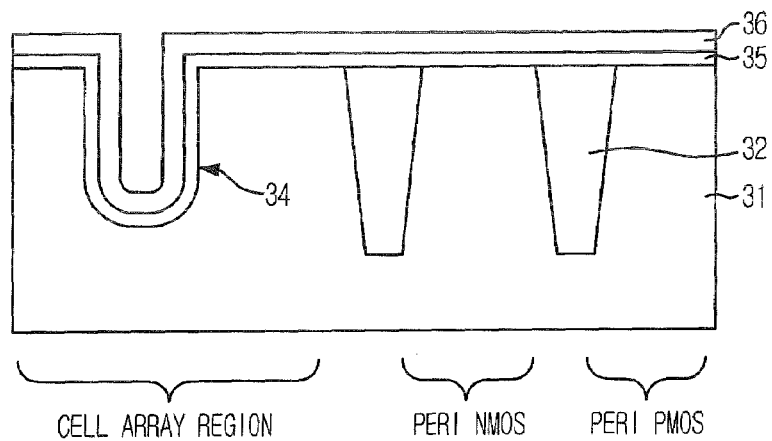

Referring to FIG. 5B, the hard mask pattern 33 is removed. Specifically, the hard mask pattern 33 is removed by wet cleaning process using buffered oxide etchant (BOE) or hydrofluoric acid (HF) solution because the hard mask is formed of silicon oxide. Herein, the BOE solution is a solution in which $NH_4F$ and HF are mixed.

A gate insulating layer 35 is formed on the resultant structure including the recessed channel region 34. The gate insulating layer 35 includes at least one selected from the group consisting of a silicon oxide ($SiO_2$) layer, a silicon oxynitride (SiON) layer, a silicon nitride ($Si_3N_4$) layer, a hafnium silicate layer and a hafnium silioxynitride (Hf—Si—O—N) layer.

A first undoped polysilicon layer 36 is deposited on the gate insulating layer 35. In detail, the first undoped polysilicon layer 36 is conformally deposited on the gate insulating layer 35, wherein the thickness of the first undoped polysilicon layer 36 should be smaller than half the width of the recessed channel region 34. The first undoped polysilicon layer 36 may be deposited to a thickness ranging from approximately 30 Å to approximately 500 Å at a deposition temperature ranging from approximately 450° C. to approximately 650° C.

Figure 5C:
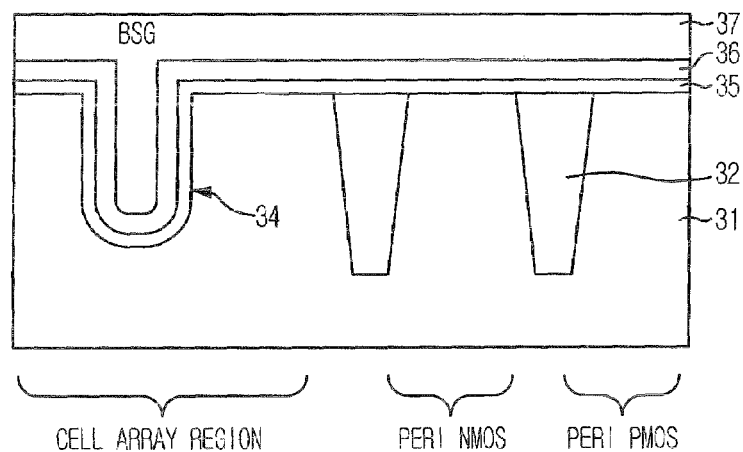

Referring to FIG. 5C, a boron (B) doped insulating layer 37 (e.g., BSG) is formed over the first undoped polysilicon layer 36. In the BSG layer 37, boron concentration is in the range of approximately 1% to approximately 20%.

Figure 5D:
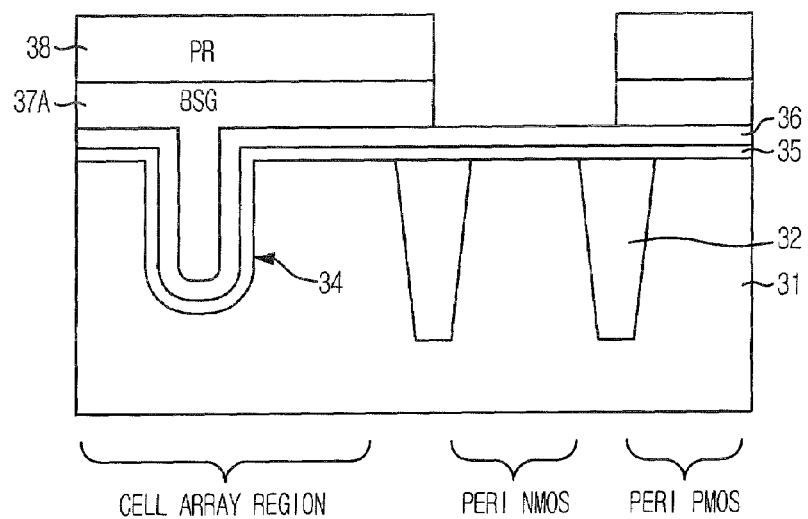

Referring to FIG. 5D, a photomask process is performed on the BSG layer 37 to form a first photoresist pattern 38 exposing the peripheral NMOS region. Whereas, the cell array region and the peripheral PMOS region are still covered with the BSG layer 37.

The BSG layer 37 of the peripheral PMOS region exposed by the first photoresist pattern 38 is selectively etched. The BSG layer 37 is etched by a dry-etching or wet-etching process, and thus a residual BSG layer 37A remains only over the cell array region and the peripheral PMOS region.

Figure 5E:
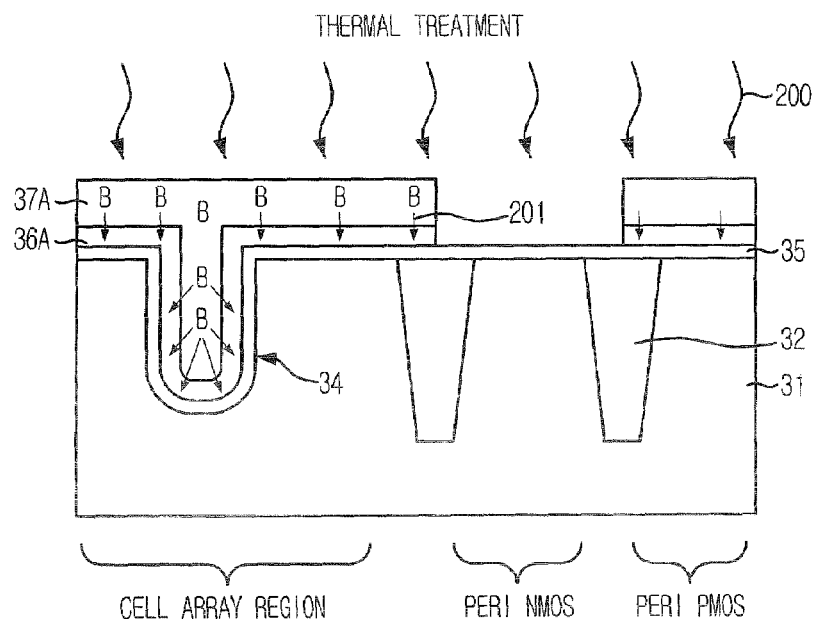

Referring to FIG. 5E, the first photoresist pattern 38 is removed. A first high-temperature thermal treatment 200 is performed to diffuse impurities (i.e., boron, see reference symbol B in FIG. 5E) existing in the residual BSG layer 37A into the first undoped polysilicon layer 36. Here, a reference numeral 201 denotes the diffusion direction of boron.

As a result, the first undoped polysilicon layer 36 of the cell array region and the peripheral PMOS region is converted into a B-doped polysilicon layer 36A. On the contrary, the first undoped polysilicon layer 36 still remains over the peripheral NMOS region as it is not being doped with boron. Therefore, an interface between the B-doped polysilicon layer 36A and the first undoped polysilicon layer 36 is formed over the device isolation structure 32 disposed between the peripheral NMSO region and the peripheral PMOS region, and between the cell array region and the peripheral NMOS region.

The first high-temperature thermal treatment 200 for boron diffusion is performed at a temperature ranging from approximately 600° C. to approximately 1,000° C. for approximately 10 seconds to approximately 60 minutes such that boron sufficiently diffuses into the first undoped polysilicon layer 36 inside the recessed channel region 34. In addition, since the residual BSG layer 27A is formed on the first undoped polysilicon layer 36 inside the recessed channel region 34, boron sufficiently diffuses around the bottom of the recessed channel region 34.

Figure 5F:
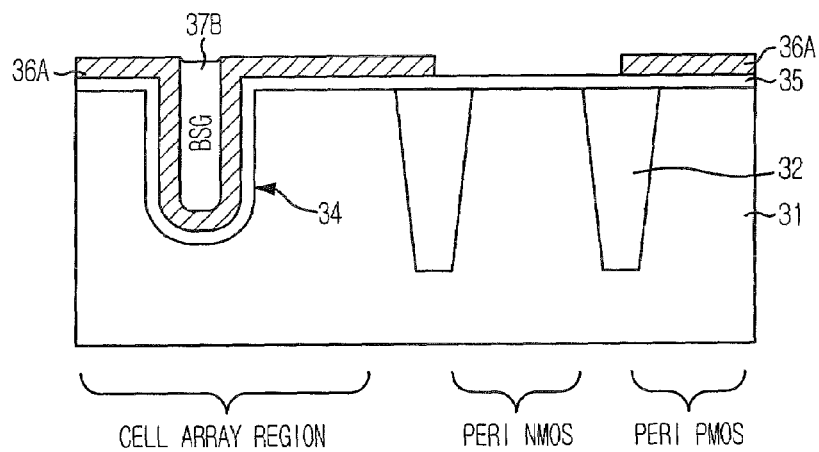

Referring to FIG. 5F, a portion of the residual BSG layer 37A which is higher than the B-doped polysilicon layer 36A is removed through a dry-etching or wet-etching process to expose the B-doped polysilicon layer 36A so that a BSG pattern 37B only remains inside the recessed channel region 34 of the cell array region. Herein, the wet-etching process is performed using a chemical containing HF, and the dry-etching process is performed using a mixed gas of $CF_4$ and $O_2$.

Thus, the BSG pattern 37B has a shape that fills the recessed channel region 34 of the cell array region. The BSG pattern 37B will play a role in preventing a gap-fill failure when depositing a second undoped polysilicon layer.

Figure 5G:
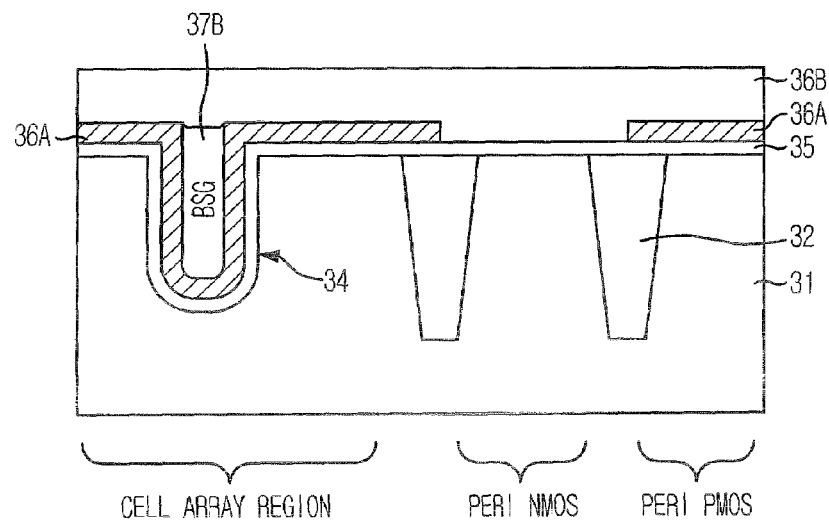

Referring to FIG. 5G, a second undoped polysilicon layer 36B is formed on the resultant structure including the BSG pattern 37B and the B-doped polysilicon layer 36A. The second undoped polysilicon layer 36B is deposited to a thickness ranging from approximately 100 Å to approximately 2,000 Å at a deposition temperature ranging from approximately 450° C. to approximately 650° C. By depositing the second undoped polysilicon layer 36B, the BSG pattern 37B has a shape that fills an inner space formed by the B-doped polysilicon layer 36A and the second undoped polysilicon layer 36B.

Figure 5H:
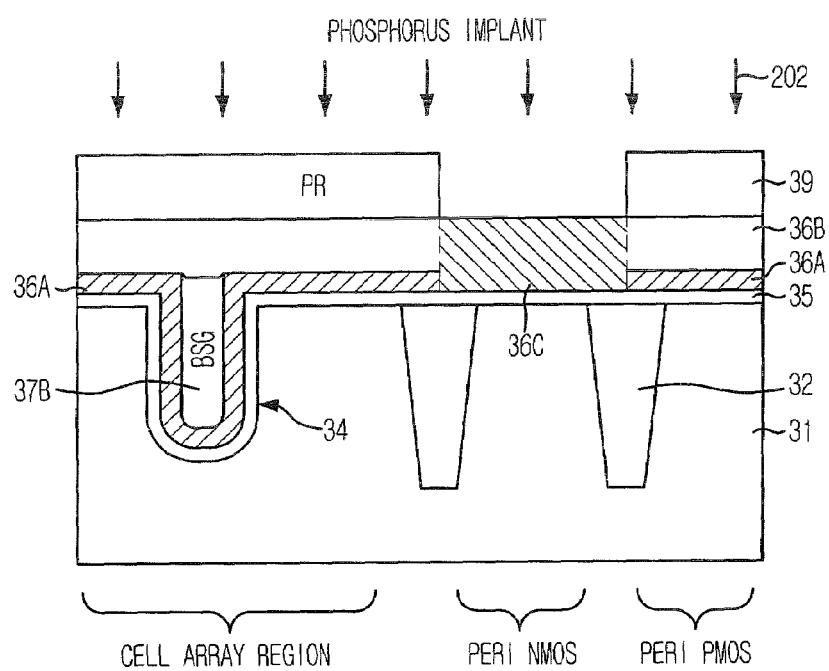
Figure 51:
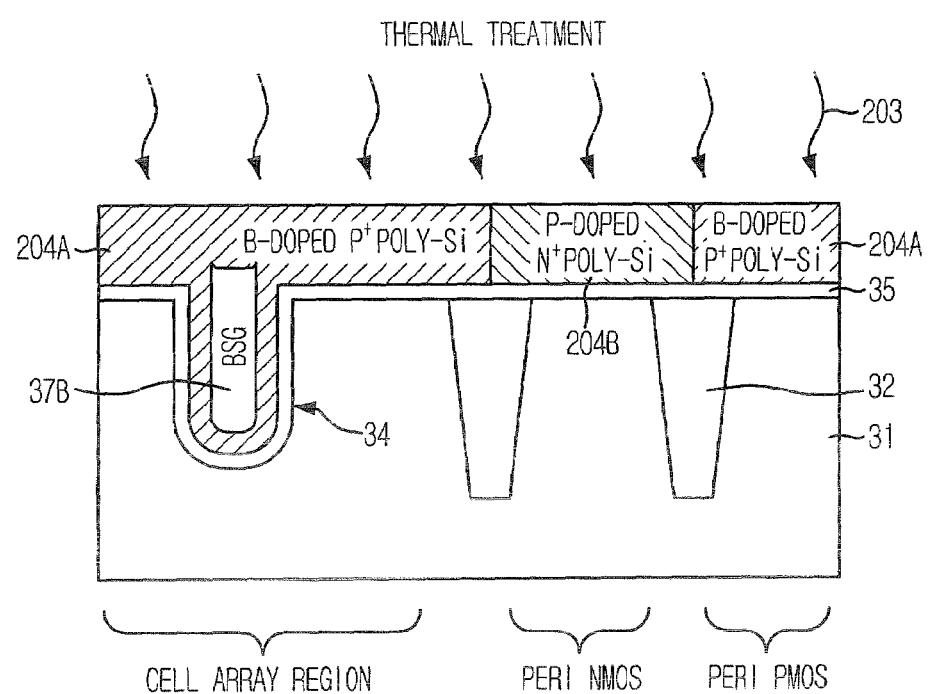

Referring to FIG. 5H, a photomask process is performed to form a second photoresist pattern 39 selectively exposing the second undoped polysilicon layer 36B of the peripheral NMOS region.

A phosphorous ion implantation 202 is performed on only the second undoped polysilicon layer 36B of the peripheral NMOS region. Thus, the second undoped polysilicon layer 36B of the peripheral NMOS region and the first undoped polysilicon layer 36 are converted into a phosphorous-doped polysilicon layer 36C. However, the second undoped polysilicon layer 36B in the cell array region and the peripheral PMOS region is left intact.

Herein, the dose of the phosphorous ion implantation is at most $1E16/cm^2$. In particular, the dose of the phosphorous ion implantation may range from approximately $3E15/cm^2$ to approximately $1E16/cm^2$. Since the phosphorous ion implantation is performed only on the second undoped polysilicon layer 36B which is not doped with any dopant, it is unnecessary to perform a counter-doping, which is different from the typical method. Therefore, it is possible to implant high concentration phosphorous ions in spite of low doses ranging from approximately $3E15/cm^2$ to approximately $1E16/cm^2$, which provides an advantageous effect of preventing the second photoresist pattern 39 from being cured.

Meanwhile, phosphorous ions are also implanted into the first undoped polysilicon layer 36 which remains over the peripheral NMOS region as it is not being doped with boron.

Referring to FIG. 5I, the second photoresist pattern 39 is removed and a second high-temperature thermal treatment 203 is then performed to form a P+ polysilicon layer 204A in the cell array region and the peripheral PMOS region, and form an N+ polysilicon layer 204B in the peripheral NMOS region. The second high-temperature thermal treatment 203 may be performed at a temperature ranging from approximately 600° C. to approximately 1,000° C. for approximately 10 seconds to approximately 60 minutes.

In detail, by means of the second high-temperature thermal treatment 203, the boron in the BSG pattern 37B and the B-doped polysilicon layer 36A diffuses into the second undoped polysilicon layer 36B evenly thereby forming the P+ polysilicon layer 204A uniformly doped with boron in the cell array region and the peripheral PMOS region. Also, by means of the second high-temperature thermal treatment 203, the phosphorous in the P-doped polysilicon layer 36C and the first undoped polysilicon layer 36 diffuses evenly thereby forming the N+ polysilicon layer 204B uniformly doped with phosphorous in the peripheral NMOS region. The phosphorous and boron ions are respectively implanted into the N+ polysilicon layer 204B and the P+ polysilicon layer 204A with a dose of at most $1E16/cm^2$.

Through the above process, the B-doped P+ polysilicon layer 204A is formed in the cell array region and the peripheral PMOS region, and simultaneously the P-doped N+ polysilicon layer 204B is formed in the peripheral NMOS region, whereby a dual polysilicon gate structure is obtained.

Although the BSG pattern 37B exists inside the B-doped P+ polysilicon, the BSG pattern 37B is disposed inside the recessed channel region 34 so that the BSG pattern 37B does not have an effect on the device characteristics.

Consequently, when the B-doped P+ polysilicon layer 204A is used as the gate electrode of the cell region, the threshold voltage rises because the boron concentration is uniform at every position, which makes it possible to prevent an off-leakage characteristic from being degraded.

Figure 6:
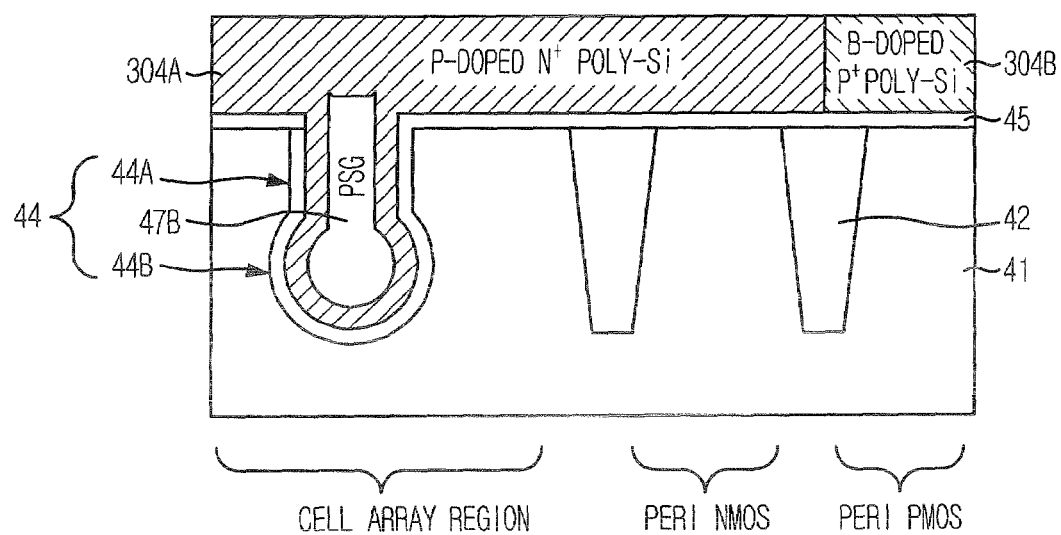
FIG. 6 illustrates a cross-sectional view of a semiconductor device having a dual polysilicon gate in accordance with a third embodiment of the present invention.

FIG. 6 illustrates a cross-sectional view of a semiconductor device having a dual polysilicon gate in accordance with a third embodiment of the present invention. In the semiconductor device of the third embodiment, a bulb-type recess channel array transistor is formed in a cell array region, and a planar transistor is formed in a peripheral circuit region.

As illustrated, a device isolation structure 42 is formed for isolating regions in a substrate 41 where a cell array region, a peripheral NMOS region, and a peripheral PMOS region are defined. Here, NMOSFETs are formed in the cell array region and the peripheral NMOS region, and PMOSFETs are formed in the peripheral PMOS region.

A bulb-type recess channel region 44 configured with a neck pattern 44A and a ball pattern 44B is formed in the substrate 41 of the cell array region, and a gate insulating layer 45 is then formed on a surface of the substrate 41 including the bulb-type recess channel region 44. Herein, both sidewalls and the bottom surface of the bulb-type recess channel region 44 act as channels so that the bulb-type recess channel region 44 provides a multi-plane channel. The gate insulating layer 45 includes at least one selected from the group consisting of a silicon oxide ($SiO_2$) layer, a silicon oxynitride (SION) layer, a silicon nitride ($Si_3N_4$) layer, a hafnium silicate layer and a hafnium silioxynitride (Hf—Si—O—N) layer.

An N+ polysilicon layer 304A filling the bulb-type recess channel region 44 is formed over the cell array region and the peripheral NMOS region. A P+ polysilicon layer 304B is formed over the peripheral PMOS region. Here, the N+ polysilicon layer 304A is a phosphorous (P) heavily doped (N+) polysilicon layer (P-doped N+ polysilicon layer), and the P+ polysilicon layer 304B is a boron-heavily doped (P+) polysilicon layer (B-doped P+ polysilicon layer).

Inside the N+ polysilicon layer 304A in the bulb-type recess channel region 44, a PSG pattern 27B is formed. Herein, the PSG pattern 27B is an insulating layer doped with phosphorous, and has a phosphorous concentration ranging from approximately 1% to approximately 20%.

In the third embodiment, a gate electrode is formed from the P-doped N+ polysilicon layer 304A in both the cell array region and the peripheral NMOS region, and a gate electrode is formed from the B-doped P+ polysilicon layer 304B in the peripheral PMOS transistor, which makes up a dual polysilicon gate (DPG) structure. The phosphorous and boron ions, with doses of at most $1E16/cm^2$, are implanted into the P-doped N+ polysilicon layer 304A and the B-doped P+ polysilicon layer 304B, respectively.

Figure 7A:
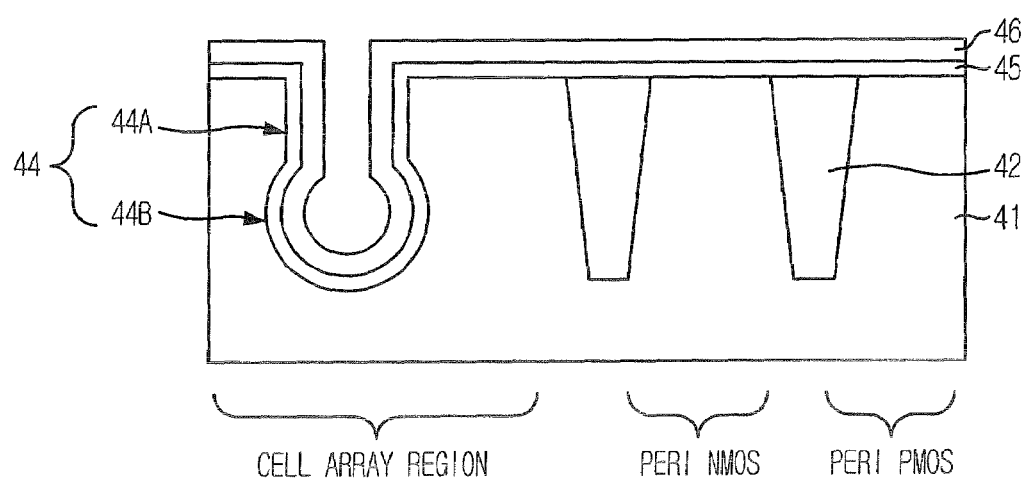
FIGS. 7A to 7H illustrate a method of forming the dual polysilicon gate in accordance with the third embodiment of the present invention.

FIGS. 7A to 7H illustrate a method of forming the dual polysilicon gate in accordance with the third embodiment of the present invention. Referring to FIG. 7A, a device isolation structure 42 is formed in a substrate 41 where a cell array region, a peripheral NMOS region and a peripheral PMOS region are defined. Here, NMOSFETs are formed in the cell array region and the peripheral NMOS region, and PMOSFETs are formed in the peripheral PMOS region. The device isolation structure 42 is formed by a typical shallow trench isolation (STI) process.

The substrate 41 of the cell array region is etched to form a bulb-type recess channel region 44 with a neck pattern 44A having a trench shape, and a ball pattern 44B. Here, the ball pattern 44B has a spherical shape with a width greater than that of the neck pattern 44A. Therefore, the bulb-type recess channel 44 provides a multi-plane channel, and has a longer channel length than the recess channel region.

A gate insulating layer 45 is formed on the resultant structure including the bulb-type recess channel region 44. The gate insulating layer 45 includes at least one selected from the group consisting of a silicon oxide ($SiO_2$) layer, a silicon oxynitride (SiON) layer, a silicon nitride ($Si_3N_4$) layer, a hafnium silicate layer and a hafnium silioxynitride (Hf—Si—O—N) layer.

A first undoped polysilicon layer 46 is deposited on the gate insulating layer 45. In detail, the first undoped polysilicon layer 46 is conformally deposited on the gate insulating layer 45, wherein the thickness of the first undoped polysilicon layer 46 should be smaller than half the width of the neck pattern 44A of the bulb-type recess channel region 44. The first undoped polysilicon layer 46 may be deposited to a thickness ranging from approximately 30 Å to approximately 500 Å at a deposition temperature ranging from approximately 450° C. to approximately 650° C.

Figure 7B:
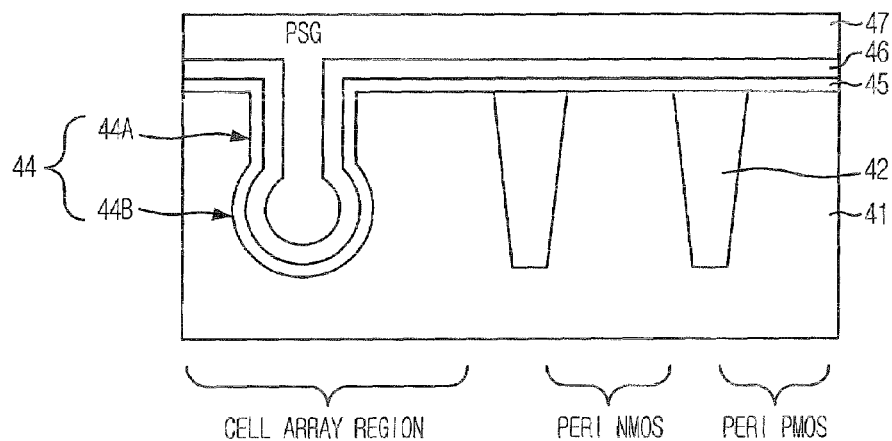

Referring to FIG. 7B, a phosphorous-doped insulating layer 47 (e.g., PSG) is formed over the first undoped polysilicon layer 46. In the PSG layer 47, the phosphorous concentration is in the range of approximately 1% to approximately 20%.

Figure 7C:
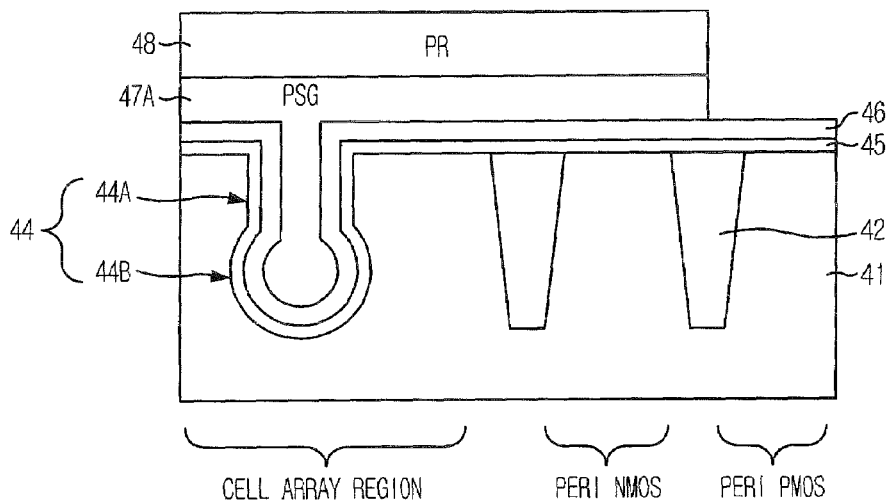

Referring to FIG. 7C, a photomask process is performed on the PSG layer 47 to form a first photoresist pattern 48 exposing the peripheral PMOS region. Whereas, the cell array region and the peripheral NMOS region are still covered with the PSG layer 47.

The PSG layer 47 of the peripheral PMOS region exposed by the first photoresist pattern 48 is selectively etched. The PSG layer 47 is etched by a dry-etching or wet-etching process, and thus a residual PSG layer 47A remains only over the cell array region and the peripheral NMOS region.

Figure 7D:
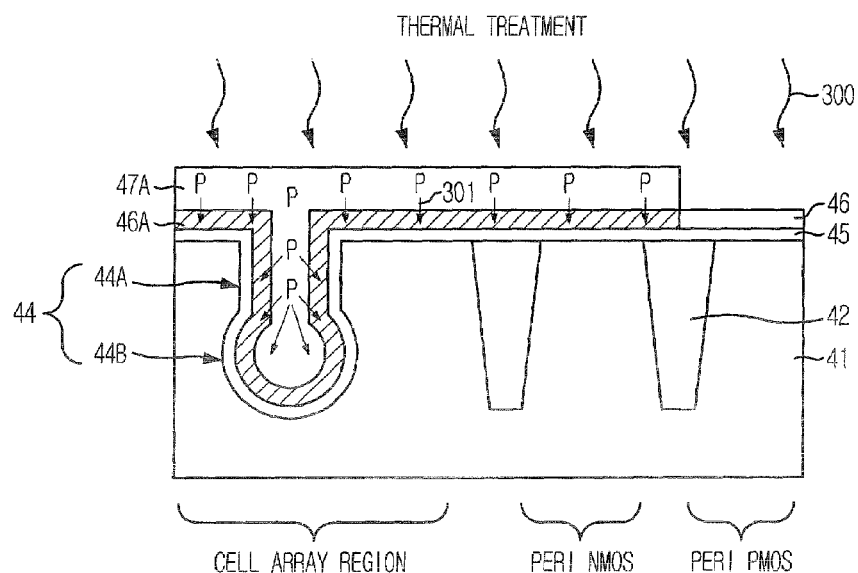

Referring to FIG. 7D, the first photoresist pattern 48 is removed. A first high-temperature thermal treatment 300 is performed to diffuse impurities (i.e., phosphorous, see reference symbol P in FIG. 7D) existing in the residual PSG layer 47A into the first undoped polysilicon layer 46. Here, a reference numeral 301 denotes the diffusion direction of phosphorous.

As a result, the first undoped polysilicon layer 46 of the cell array region and the peripheral NMOS region is converted into a P-doped polysilicon layer 46A. On the contrary, the first undoped polysilicon layer 46 still remains over the peripheral PMOS region as it is not being doped with phosphorous. Therefore, an interface between the P-doped polysilicon layer 46A and the first undoped polysilicon layer 46 is formed over the device isolation structure 42 disposed between the peripheral NMSO region and the peripheral PMOS region.

The first high-temperature thermal treatment 300 for phosphorous diffusion is performed at a temperature ranging from approximately 600° C. to approximately 1,000° C. for approximately 10 seconds to approximately 60 minutes such that phosphorous sufficiently diffuses into the first undoped polysilicon layer 46 inside the bulb-type recess channel region 44. In addition, since the residual PSG layer 47A is formed on the first undoped polysilicon layer 46 inside the bulb-type recess channel region 44, phosphorous sufficiently diffuses around the bottom of the bulb-type recess channel region 44.

Figure 7E:
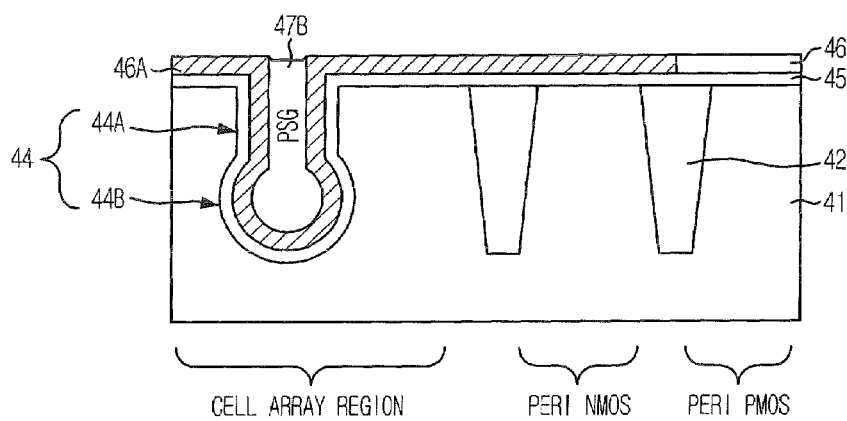

Referring to FIG. 7E, a portion of the residual PSG layer 47A which is higher than the P-doped polysilicon layer 46A is removed through a dry-etching or wet-etching process to expose the P-doped polysilicon layer 46A so that a PSG pattern 47B only remains inside the bulb-type recess channel region 44 of the cell array region. Herein, the wet-etching process is performed using a chemical containing HF, and the dry-etching process is performed using a mixed gas of $CF_4$ and $O_2$.

Thus, the PSG pattern 47B has a shape that fills the bulb-type recess channel region 44 of the cell array region. The PSG pattern 47B will play a role in preventing a gap-fill failure when depositing a second undoped polysilicon layer.

Figure 7F:
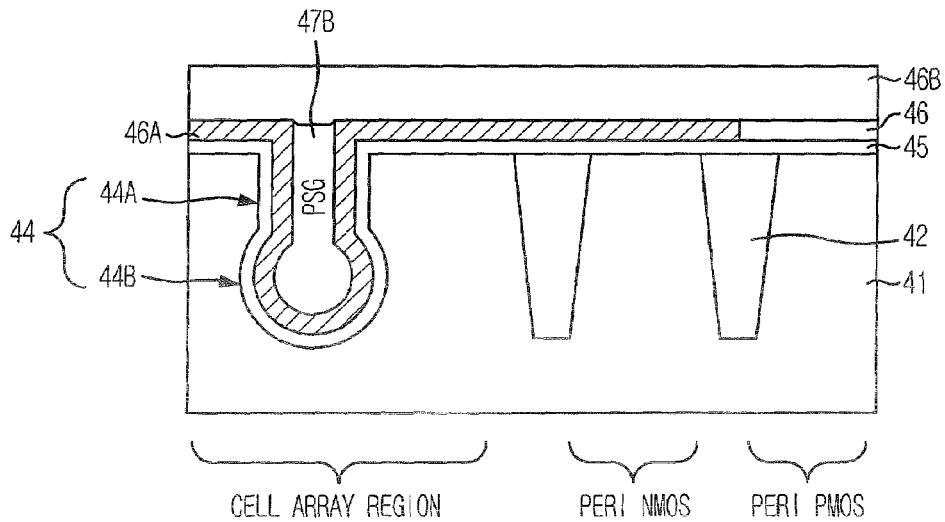

Referring to FIG. 7F, a second undoped polysilicon layer 46B is formed on the resultant structure including the PSG pattern 47B and the P-doped polysilicon layer 46A. The second undoped polysilicon layer 46B is deposited to a thickness ranging from approximately 100 Å to approximately 2,000 Å at a deposition temperature ranging from 450° C. to approximately 650° C. By depositing the second undoped polysilicon layer 46B, the PSG pattern 47B has a shape that fills an inner space formed by the P-doped polysilicon layer 46A and the second undoped polysilicon layer 46B.

Figure 7G:
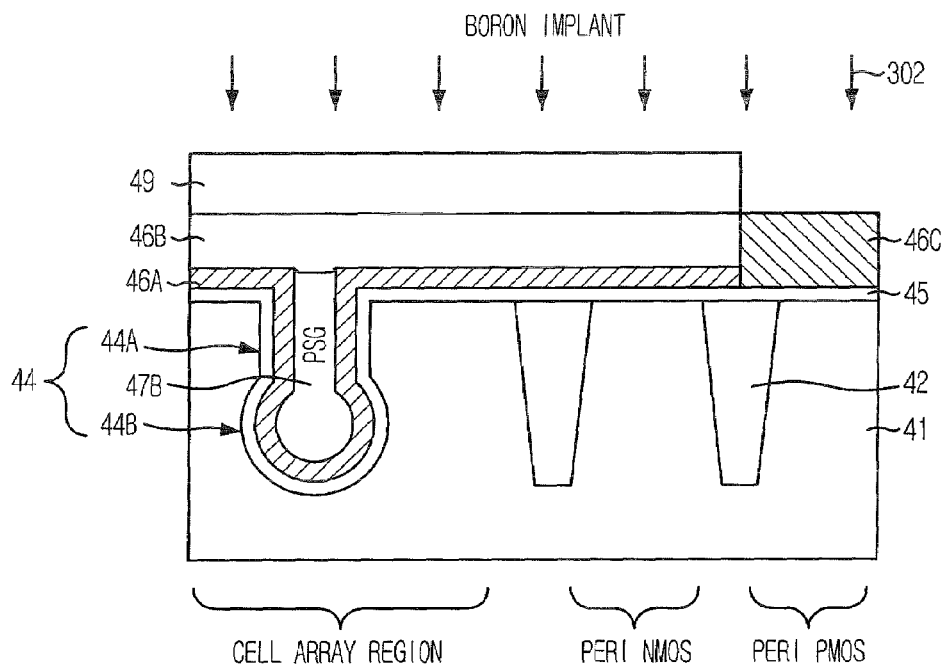

Referring to FIG. 7G, a photomask process is performed to form a second photoresist pattern 49 selectively exposing the second undoped polysilicon layer 46B of the peripheral PMOS region.

A boron ion implantation 302 is performed on only the second undoped polysilicon layer 46B of the peripheral PMOS region. Thus, the second undoped polysilicon layer 46B of the peripheral PMOS region and the first undoped polysilicon layer 46 are converted into a boron (B) doped polysilicon layer 46C. However, the second undoped polysilicon layer 46B in the cell array region and the peripheral NMOS region is left intact.

Herein, the dose of the boron ion implantation is at most $1E16/cm^2$. In particular, the dose of the boron ion implantation may range from approximately $3E15/cm^2$ to approximately $1E16/cm^2$. Since the boron ion implantation 302 is performed only on the second undoped polysilicon layer 46B which is not doped with any dopant, it is unnecessary to perform a counter-doping, which is different from the typical method. Therefore, it is possible to implant high concentration boron ions in spite of low doses ranging from approximately $3E15/cm^2$ to approximately $1E16/cm^2$, which provides an advantageous effect of preventing the second photoresist pattern 49 from being cured.

Meanwhile, boron ions are also implanted into the first undoped polysilicon layer 46 which remains over the peripheral PMOS region as it is not being doped with phosphorous.

Figure 7H:
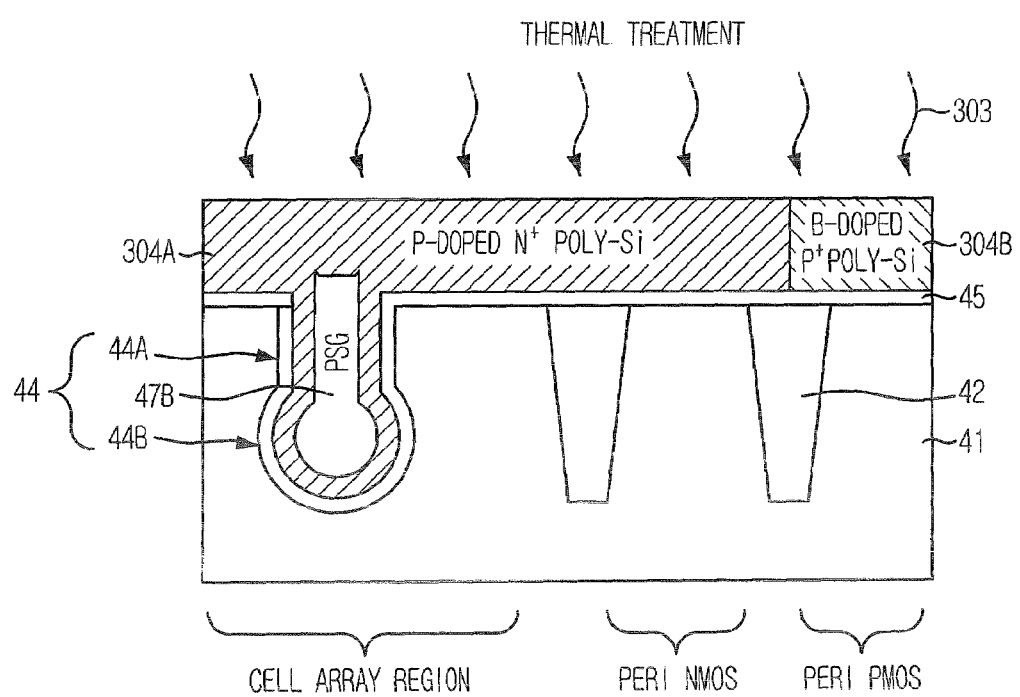

Referring to FIG. 7H, the second photoresist pattern 49 is removed and a second high-temperature thermal treatment 303 is then performed to form an N+ polysilicon layer 304A in the cell array region and the peripheral NMOS region, and form a P+ polysilicon layer 304B in the peripheral PMOS region. The second high-temperature thermal treatment 303 may be performed at a temperature ranging from approximately 600° C. to approximately 1,000° C. for approximately 10 seconds to approximately 60 minutes.

In detail, by means of the second high-temperature thermal treatment 303, the phosphorous in the PSG pattern 47B and the P-doped polysilicon layer 46A diffuses into the second undoped polysilicon layer 46B evenly thereby forming the N+ polysilicon layer 304A uniformly doped with phosphorous in the cell array region and the peripheral NMOS region. Also, by means of the second high-temperature thermal treatment 303, the boron in the B-doped polysilicon layer 46C and the first undoped polysilicon layer 46 diffuses evenly thereby forming the P+ polysilicon layer 304B uniformly doped with boron in the peripheral PMOS region. The phosphorous and boron ions are respectively implanted into the N+ polysilicon layer 304A and the P+ polysilicon layer 304B with a dose of at most $1E16/cm^2$.

Through the above process, the P-doped N+ polysilicon layer 304A is formed in the cell array region and the peripheral NMOS region, and simultaneously the B-doped P+ polysilicon layer 304B is formed in the peripheral PMOS region, whereby a dual polysilicon gate structure is obtained.

Although the PSG pattern 47B exists inside the P-doped N+ polysilicon, the PSG pattern 47B is disposed inside the bulb-type recess channel region 44 so that the PSG pattern 47B does not have an effect on the device characteristics.

Figure 8:
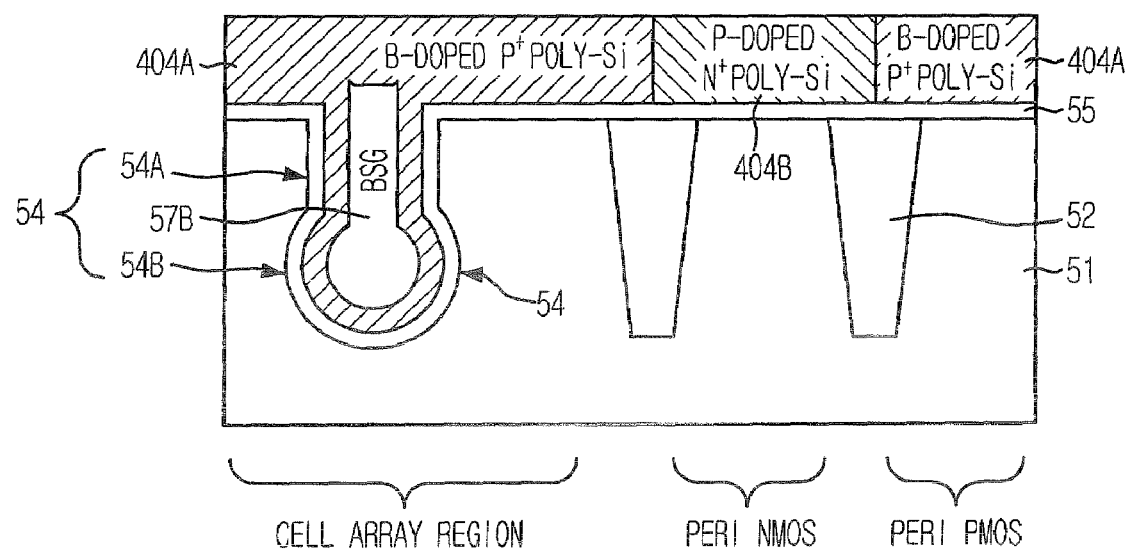
FIG. 8 illustrates a cross-sectional view of a semiconductor device having a dual polysilicon gate in accordance with a fourth embodiment of the present invention.

FIG. 8 illustrates a cross-sectional view of a semiconductor device having a dual polysilicon gate in accordance with a fourth embodiment of the present invention. In the semiconductor device of the fourth embodiment, a bulb-type recess channel array transistor is formed in a cell array region, and a planar transistor is formed in a peripheral circuit region.

As illustrated, a device isolation structure 52 is formed for isolating regions in a substrate 51 where a cell array region, a peripheral NMOS region, and a peripheral PMOS region are defined. Here, NMOSFETs are formed in the cell array region and the peripheral NMOS region, and PMOSFETs are formed in the peripheral PMOS region.

A bulb-type recess channel region 54 configured with a neck pattern 54A and a ball pattern 54B is formed in the substrate 51 of the cell array region, and a gate insulating layer 55 is then formed on a surface of the substrate 51 including the bulb-type recess channel region 54. Herein, both sidewalls and the bottom surface of the bulb-type recess channel region 54 act as channels so that the bulb-type recess channel region 54 provides a multi-plane channel. The gate insulating layer 55 includes at least one selected from the group consisting of a silicon oxide ($SiO_2$) layer, a silicon oxynitride (SiON) layer, a silicon nitride ($Si_3N_4$) layer, a hafnium silicate layer and a hafnium silioxynitride (Hf—Si—O—N) layer.

A P+ polysilicon layer 404A filling the bulb-type recess channel region 54 is formed over the cell array region and the peripheral PMOS region. An N+ polysilicon layer 404B is formed over the peripheral NMOS region. Here, the N+ polysilicon layer 404B is a phosphorous (P) heavily doped (N+) polysilicon layer (P-doped N+ polysilicon layer), and the P+ polysilicon layer 404A is a boron-heavily doped (P+) polysilicon layer (B-doped P+ polysilicon layer).

Inside the P+ polysilicon layer 404A in the bulb-type recess channel region 54, a boron silicate glass (BSG) pattern 57B is formed. Herein, the BSG pattern 57B is an insulating layer doped with boron, and has a boron concentration ranging from approximately 1% to approximately 20%.

In the fourth embodiment, a gate electrode is formed from the B-doped P+ polysilicon layer 404A in both the cell array region and the peripheral PMOS region, and a gate electrode is formed from the P-doped N+ polysilicon layer 404B in the peripheral NMOS transistor, which makes up a dual polysilicon gate (DPG) structure. The phosphorous and boron ions with doses of at most $1E16/cm^2$ are implanted into the P-doped N+ polysilicon layer 404B and the B-doped P+ polysilicon layer 404A, respectively.

Consequently, when the B-doped P+ polysilicon layer 404A is used as the gate electrode of the cell region, the threshold voltage rises because the boron concentration is uniform at every position, which makes it possible to prevent an off-leakage characteristic from being degraded.

Figure 9A:
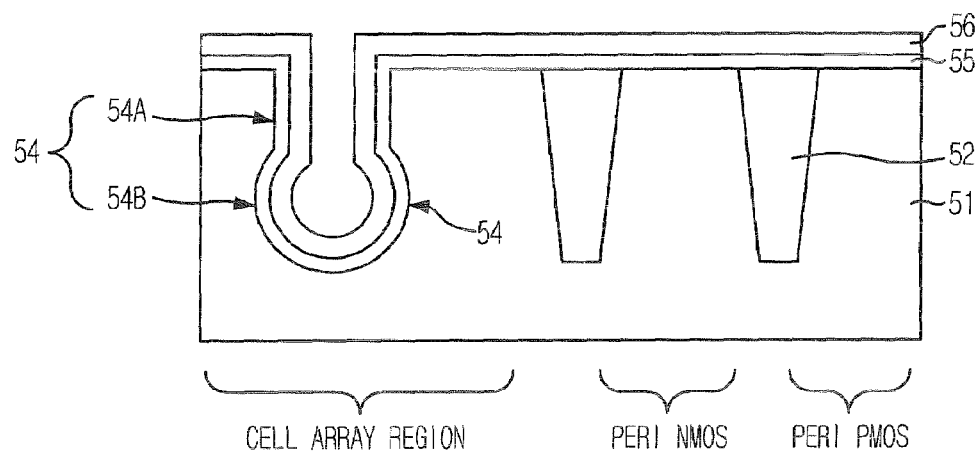
FIGS. 9A to 9H illustrate a method of forming the dual polysilicon gate in accordance with the fourth embodiment of the present invention.

FIGS. 9A to 9H illustrate a method of forming the dual polysilicon gate in accordance with the fourth embodiment of the present invention. Referring to FIG. 9A, a device isolation structure 52 is formed in a substrate 51 where a cell array region, a peripheral NMOS region and a peripheral PMOS region are defined. Here, NMOSFETs are formed in the cell array region and the peripheral NMOS region, and PMOSFETs are formed in the peripheral PMOS region. The device isolation structure 52 is formed by a typical shallow trench isolation (STI) process.

After forming a hard mask layer on the resultant structure, the hard mask layer is patterned to form a hard mask pattern 33 defining a recessed channel region in the substrate 51 of the cell array region. Here, the hard mask layer is formed of a dielectric material such as silicon oxide ($SiO_2$).

The substrate 51 of the cell array region is etched to form a bulb-type recess channel region 54 configured with a neck pattern 54A having a trench shape, and a ball pattern 54B. Here, the ball pattern 54B has a spherical shape with a width greater than that of the neck pattern 54A. Therefore, the bulb-type recess channel region 54 provides a multi-plane channel, and has a longer channel length than the recess channel region.

A gate insulating layer 55 is formed on the resultant structure including the bulb-type recess channel region 54. The gate insulating layer 55 includes at least one selected from the group consisting of a silicon oxide ($SiO_2$) layer, a silicon oxynitride (SiON) layer, a silicon nitride ($Si_3N_4$) layer, a hafnium silicate layer and a hafnium silioxynitride (Hf—Si—O—N) layer.

A first undoped polysilicon layer 56 is deposited on the gate insulating layer 55. In detail, the first undoped polysilicon layer 56 is conformally deposited on the gate insulating layer 55, wherein the thickness of the first undoped polysilicon layer 56 should be smaller than half the width of the neck pattern 54A of the bulb-type recess channel region 54. The first undoped polysilicon layer 56 may be deposited to a thickness ranging from approximately 30 Å to approximately 500 Å at a deposition temperature ranging from approximately 450° C. to approximately 650° C.

Figure 9B:
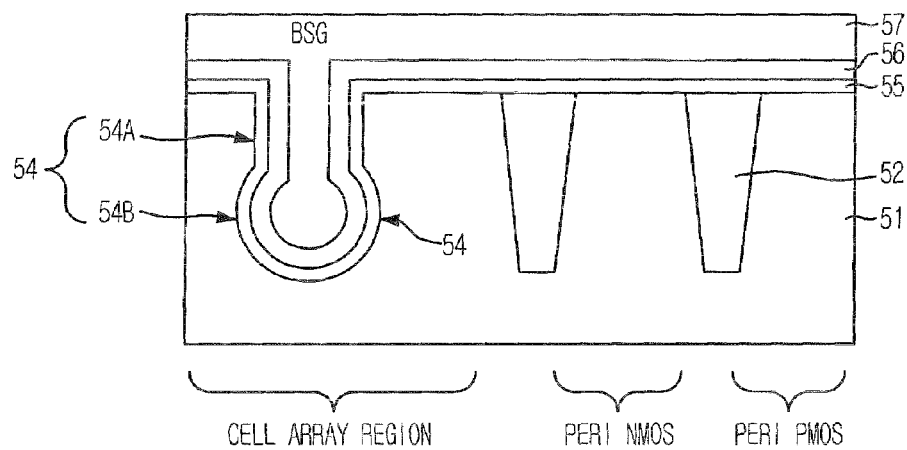

Referring to FIG. 9B, a boron (B) doped insulating layer 57, e.g., BSG, is formed over the first undoped polysilicon layer 56. In the BSG layer 57, the boron concentration is in the range of approximately 1% to approximately 20%.

Figure 9C:
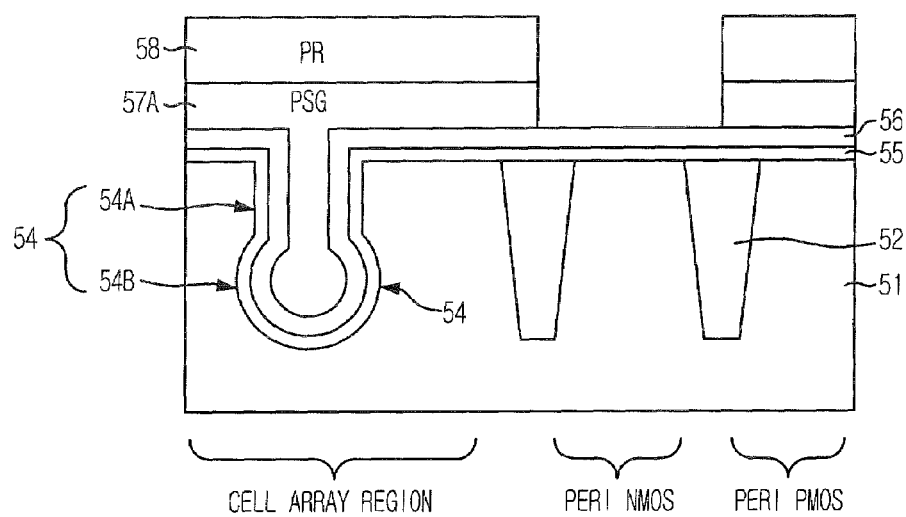

Referring to FIG. 9C, a photomask process is performed on the BSG layer 57 to form a first photoresist pattern 58 exposing the peripheral NMOS region. Whereas, the cell array region and the peripheral PMOS region are still covered with the BSG layer 57.

The BSG layer 57 of the peripheral PMOS region exposed by the first photoresist pattern 58 is selectively etched. The BSG layer 57 is etched by a dry-etching or wet-etching process, and thus a residual BSG layer 57A remains only over the cell array region and the peripheral PMOS region.

Figure 9D:
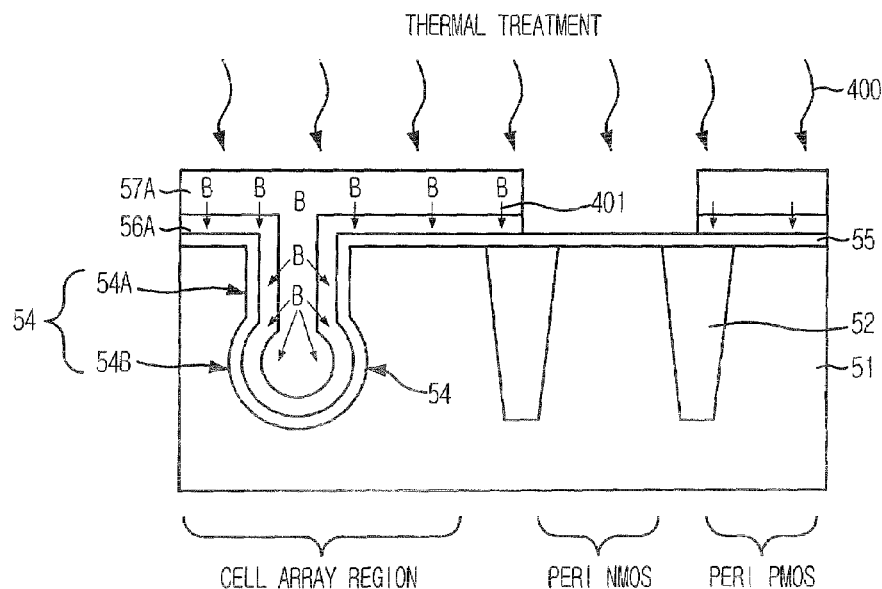

Referring to FIG. 9D, the first photoresist pattern 58 is removed. A first high-temperature thermal treatment 400 is performed to diffuse impurities (i.e., boron) existing in the residual BSG layer 57A into the first undoped polysilicon layer 56. Here, a reference numeral 401 denotes the diffusion direction of boron.

As a result, the first undoped polysilicon layer 56 of the cell array region and the peripheral PMOS region is converted into a B-doped polysilicon layer 56A. On the contrary, the first undoped polysilicon layer 56 still remains over the peripheral NMOS region as it is not being doped with boron. Therefore, an interface between the B-doped polysilicon layer 56A and the first undoped polysilicon layer 56 is formed over the device isolation structure 52 disposed between the peripheral NMSO region and the peripheral PMOS region, and between the cell array region and the peripheral NMOS region.

The first high-temperature thermal treatment 400 for diffusing boron is performed at a temperature ranging from approximately 600° C. to approximately 1,000° C. for approximately 10 seconds to approximately 60 minutes such that boron sufficiently diffuses into the first undoped polysilicon layer 56 inside the bulb-type recess channel region 54. In addition, since the residual BSG layer 57A is formed on the first undoped polysilicon layer 56 inside the bulb-type recess channel region 54, boron sufficiently diffuses around the bottom of the bulb-type recess channel region 54.

Figure 9E:
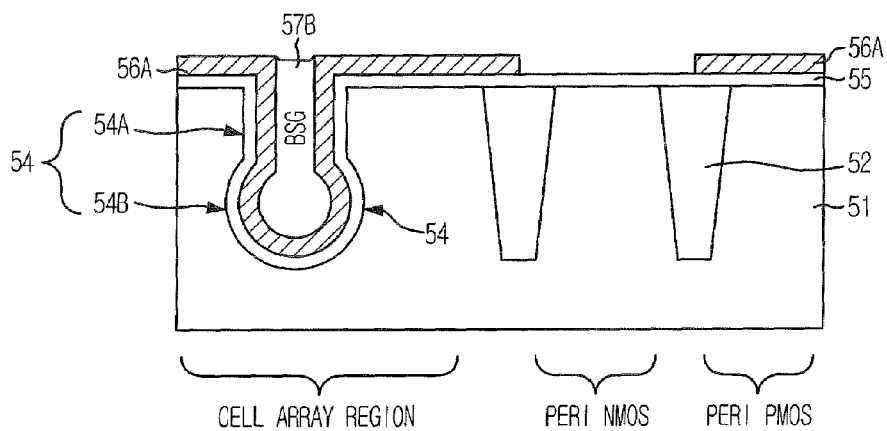

Referring to FIG. 9E, a portion of the residual BSG layer 57A which is higher than the B-doped polysilicon layer 56A is removed through a dry-etching or wet-etching process to expose the B-doped polysilicon layer 56A so that a BSG pattern 57B only remains inside the bulb-type recess channel region 54 of the cell array region. Herein, the wet-etching process is performed using a chemical containing HF, and the dry-etching process is performed using a mixed gas of $CF_4$ and $O_2$.

Thus, the BSG pattern 57B has a shape that fills the bulb-type recess channel region 54 of the cell array region. The BSG pattern 57B will play a role in preventing a gap-fill failure when depositing a second undoped polysilicon layer.

Figure 9F:
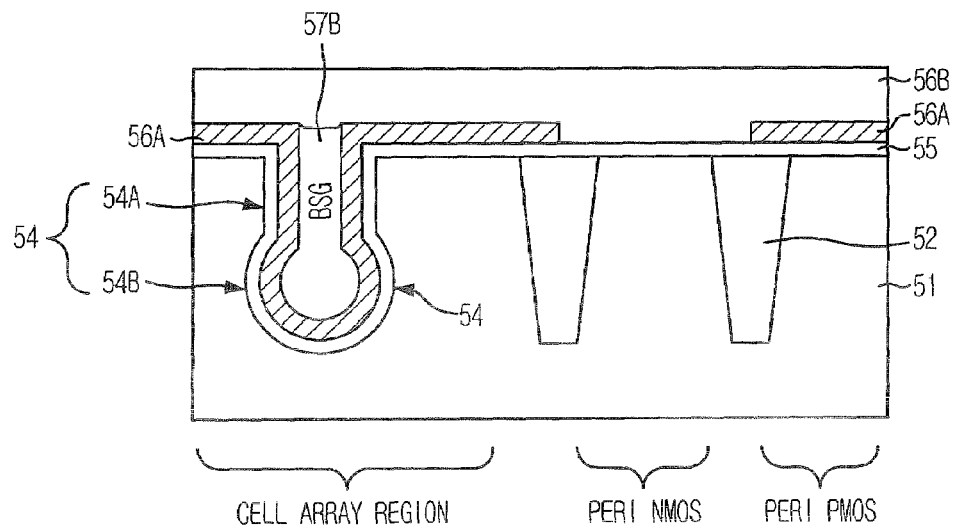

Referring to FIG. 9F, a second undoped polysilicon layer 56B is formed on the resultant structure including the BSG pattern 57B and the B-doped polysilicon layer 56A. The second undoped polysilicon layer 56B is deposited to a thickness ranging from approximately 100 Å to approximately 2,000 Å at a deposition temperature ranging from approximately 450° C. to approximately 650° C. By depositing the second undoped polysilicon layer 56B, the BSG pattern 57B has a shape that fills an inner space formed by the B-doped polysilicon layer 56A and the second undoped polysilicon layer 56B.

Figure 9G:
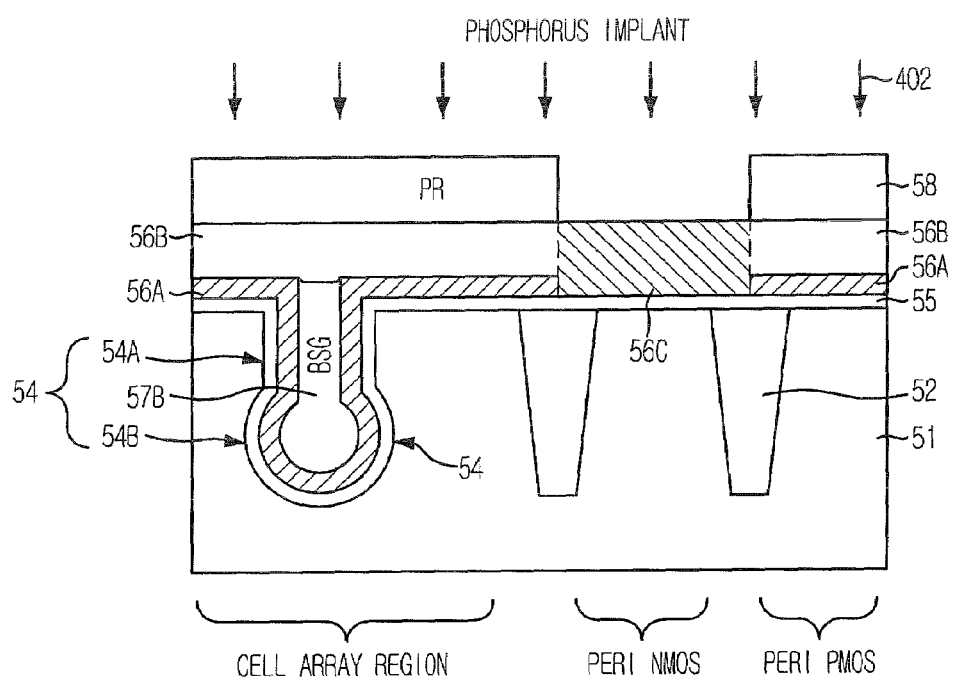

Referring to FIG. 9G, a photomask process is performed to form a second photoresist pattern 59 selectively exposing the second undoped polysilicon layer 56B of the peripheral NMOS region.

A phosphorous ion implantation 402 is performed on only the second undoped polysilicon layer 56B of the peripheral NMOS region. Thus, the second undoped polysilicon layer 56B of the peripheral NMOS region and the first undoped polysilicon layer 56 are converted into a phosphorous-doped polysilicon layer 56C. However, the second undoped polysilicon layer 56B in the cell array region and the peripheral PMOS region is left intact.

Herein, a dose of the phosphorous ion implantation is at most $1E16/cm^2$. In particular, the dose of the phosphorous ion implantation may range from approximately $3E15/cm^2$ to approximately $1E16/cm^2$. Since the phosphorous ion implantation is performed only on the second undoped polysilicon layer 56B which is not doped with any dopant, it is unnecessary to perform a counter-doping. Therefore, it is possible to implant high concentration phosphorous ions in spite of low doses ranging from approximately $3E15/cm^2$ to approximately $1E16/cm^2$, which provides an advantageous effect of preventing the second photoresist pattern 59 from being cured.

Meanwhile, phosphorous ions are also implanted into the first undoped polysilicon layer 56 which remains over the peripheral NMOS region as it is not being doped with boron.

Figure 9H:
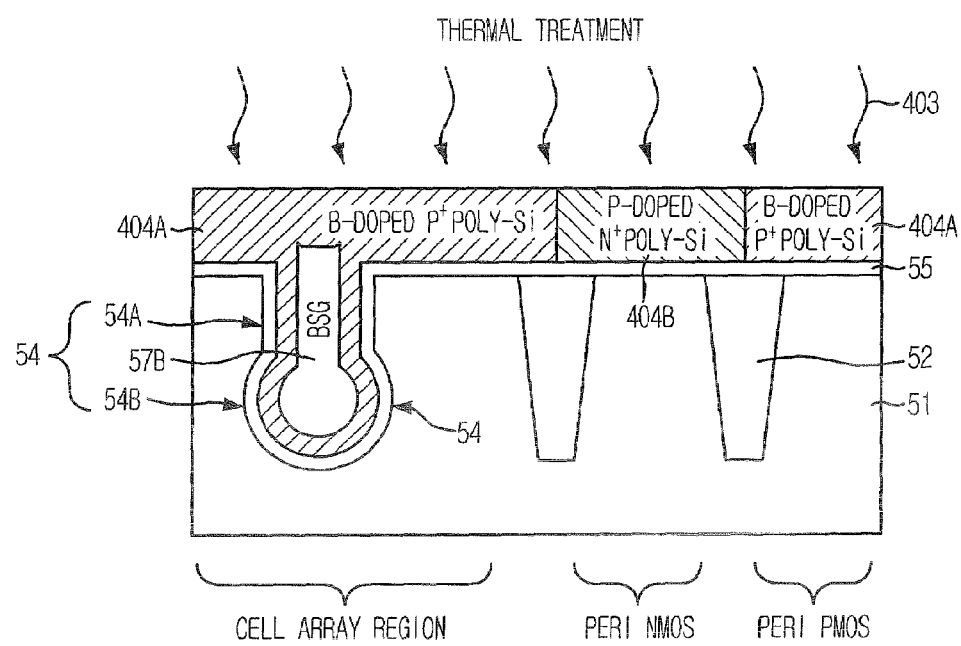

Referring to FIG. 9H, the second photoresist pattern 59 is removed and a second high-temperature thermal treatment 403 is then performed to form a P+ polysilicon layer 404A in the cell array region and the peripheral PMOS region, and form an N+ polysilicon layer 404B in the peripheral NMOS region. The second high-temperature thermal treatment 403 may be performed at a temperature ranging from approximately 600° C. to approximately 1,000° C. for approximately 10 seconds to approximately 60 minutes.

In detail, by means of the second high-temperature thermal treatment 203, the boron in the BSG pattern 57B and the B-doped polysilicon layer 56A diffuses into the second undoped polysilicon layer 56B evenly thereby forming the P+ polysilicon layer 404A uniformly doped with boron in the cell array region and the peripheral PMOS region. Also, by means of the second high-temperature thermal treatment 403, the phosphorous in the P-doped polysilicon layer 56C and in the first undoped polysilicon layer 56 diffuses evenly thereby forming the N+ polysilicon layer 404B uniformly doped with phosphorous in the peripheral NMOS region. The phosphorous and boron ions are respectively implanted into the N+ polysilicon layer 404B and the P+ polysilicon layer 404A with a dose of at most $1E16/cm^2$.

Through the above process, the B-doped P+ polysilicon layer 404A is formed in the cell array region and the peripheral PMOS region, and simultaneously the P-doped N+ polysilicon layer 404B is formed in the peripheral NMOS region, whereby a dual polysilicon gate structure is obtained.

Although the BSG pattern 57B exists inside the B-doped P+ polysilicon, the BSG pattern 57B is disposed inside the bulb-type recess channel region 54 so that the BSG pattern 57B does not have an effect on the device characteristics.

Consequently, when the B-doped P+ polysilicon layer 404A is used as the gate electrode of the cell region, the threshold voltage rises because the boron concentration is uniform at every position, which makes it possible to prevent an off-leakage characteristic from being degraded.

Figure 10:
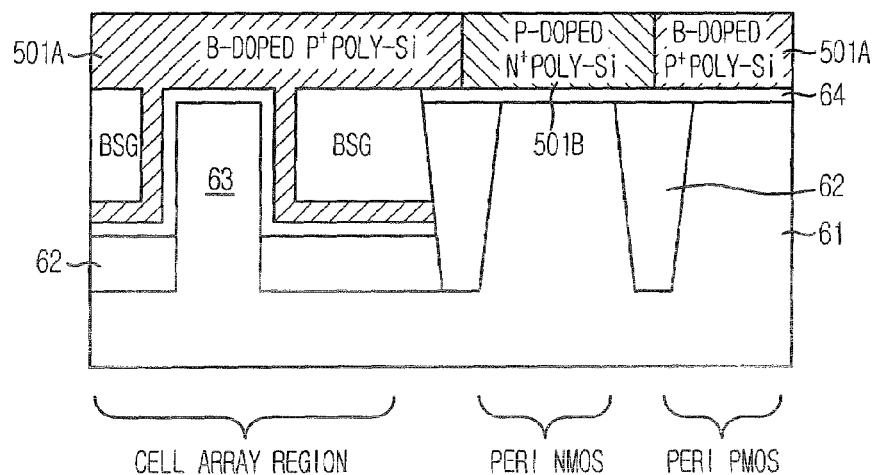
FIG. 10 illustrates a cross-sectional view of a semiconductor device having a dual polysilicon gate in accordance with a fifth embodiment of the present invention.

FIG. 10 illustrates a cross-sectional view of a semiconductor device having a dual polysilicon gate in accordance with a fifth embodiment of the present invention. In the semiconductor device of the fifth embodiment, a FinFET is formed in a cell array region, and a planar transistor is formed in a peripheral circuit region.

As illustrated, a device isolation structure 62 is formed for isolating regions in a substrate 61 where a cell array region, a peripheral NMOS region, and a peripheral PMOS region are defined. Here, NMOSFETs are formed in the cell array region and the peripheral NMOS region, and PMOSFETs are formed in the peripheral PMOS region.

A fin shaped channel region 63 is formed in the substrate 61 of the cell array region such that it protrudes upward, and a gate insulating layer 64 is then formed on a surface of the substrate 61 including the fin shaped channel region 63. Herein, both sidewalls and the bottom surface of the fin shaped channel region 63 act as channels so that the fin shaped channel region 63 provides a multi-plane channel. The gate insulating layer 64 includes at least one selected from the group consisting of a silicon oxide ($SiO_2$) layer, a silicon oxynitride (SiON) layer, a silicon nitride ($Si_3N_4$) layer, a hafnium silicate layer and a hafnium silioxynitride (Hf—Si—O—N) layer.

A P+ polysilicon layer 501A encompassing both sides of the fin shaped channel region 63 is formed over the cell array region and the peripheral PMOS region. An N+ polysilicon layer 501B is formed over the peripheral NMOS region. Here, the N+ polysilicon layer 501B is a phosphorous (P) heavily doped (N+) polysilicon layer (P-doped N+ polysilicon layer), and the P+ polysilicon layer 501A is a boron-heavily doped (P+) polysilicon layer (B-doped P+ polysilicon layer).

Inside the P+ polysilicon layer 501A outside the fin shaped channel region 63, a BSG pattern is formed. Herein, the BSG pattern is an insulating layer doped with boron, and has a boron concentration ranging from approximately 1% to approximately 20%.

In the fifth embodiment, a gate electrode is formed from the B-doped P+ polysilicon layer 501A in both the cell array region and the peripheral PMOS region, and a gate electrode is formed from the P-doped N+ polysilicon layer 501B in the peripheral NMOS transistor, which makes up a dual polysilicon gate (DPG) structure. The phosphorous and boron ions with doses of at most $1E16/cm^2$ are implanted into the P-doped N+ polysilicon layer 501B and the B-doped P+ polysilicon layer 501A, respectively.

Consequently, when the B-doped P+ polysilicon layer 501A is used as the gate electrode of the cell region, the threshold voltage rises because the boron concentration is uniform at every position, which makes it possible to prevent an off-leakage characteristic from being degraded.

Figure 11:
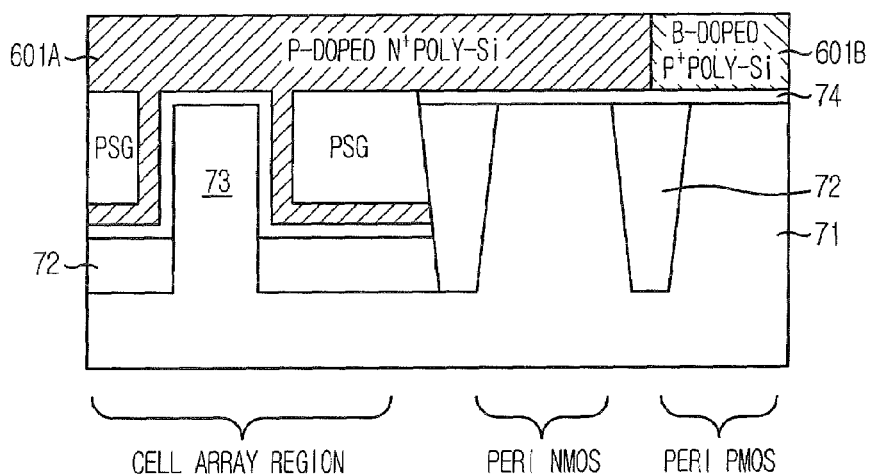
FIG. 11 illustrates a cross-sectional view of a semiconductor device having a dual polysilicon gate in accordance with a sixth embodiment of the present invention.

FIG. 11 illustrates a cross-sectional view of a semiconductor device having a dual polysilicon gate in accordance with a sixth embodiment of the present invention. In the semiconductor device of the sixth embodiment, a FinFET is formed in a cell array region, and a planar transistor is formed in a peripheral circuit region.

As illustrated, a device isolation structure 72 is formed for isolating regions in a substrate 71 where a cell array region, a peripheral NMOS region, and a peripheral PMOS region are defined. Here, NMOSFETs are formed in the cell array region and the peripheral NMOS region, and PMOSFETs are formed in the peripheral PMOS region.

A fin shaped channel region 73 is formed in the substrate 71 of the cell array region such that it protrudes upward, and a gate insulating layer 74 is then formed on the surface of the substrate 71 including the fin shaped channel region 73. Herein, both sidewalls and the bottom surface of the fin shaped channel region 73 act as channels so that the fin shaped channel region 73 provides a multi-plane channel. The gate insulating layer 74 includes at least one selected from the group consisting of a silicon oxide ($SiO_2$) layer, a silicon oxynitride (SiON) layer, a silicon nitride ($Si_3N_4$) layer, a hafnium silicate layer and a hafnium silioxynitride (Hf—Si—O—N) layer.

An N+ polysilicon layer 601A encompassing both sides of the fin shaped channel region 73 is formed over the cell array region and the peripheral NMOS region. An N+ polysilicon layer 601B is formed over the peripheral PMOS region. Here, the N+ polysilicon layer 601A is a phosphorous (P) heavily doped (N+) polysilicon layer (P-doped N+ polysilicon layer), and the P+ polysilicon layer 601B is a boron-heavily doped (P+) polysilicon layer (B-doped P+ polysilicon layer).

Inside the N+ polysilicon layer 601A outside the fin shaped channel region 73, a PSG pattern is formed. Herein, the PSG pattern is an insulating layer doped with phosphorous, and has phosphorous concentration ranging from approximately 1% to approximately 20%.

In the sixth embodiment, a gate electrode is formed from the P-doped N+ polysilicon layer 601A in both the cell array region and the peripheral NMOS region, and a gate electrode is formed from the B-doped P+ polysilicon layer 601B in the peripheral PMOS transistor, which makes up a dual polysilicon gate (DPG) structure. The phosphorous and boron ions with doses of at most $1E16/cm^2$ are implanted into the P-doped N+ polysilicon layer 601A and the B-doped P+ polysilicon layer 601B, respectively.

In the fifth and sixth embodiments, there are illustrated the dual gate structure including the FinFET having the fin shaped channel which is known as a multi-plane channel such as the recessed channel and bulb-type recess channel. As described in the first to fourth embodiments, methods for fabricating the dual gate structure in accordance with the fifth and sixth embodiments may also employ the thermal treatment for diffusing phosphorous and boron using the PSG layer and the BSG layer, the ion implantation of boron, and the ion implantation of phosphorous.

In the dual polysilicon gate including the transistor having a channel region protruded like a fin shaped channel, the phosphorous and boron ions with doses of at most $1E16/cm^2$ (e.g., preferably approximately $3E15/cm^2$ to approximately $1E16/cm^2$) may be implanted into the P-doped N+ polysilicon layer and the B-doped P+ polysilicon layer.

The present invention can also be applied to the dual polysilicon gate of the memory device including a saddle shaped channel transistor having a protruded channel region like the fin shaped channel.

In accordance with the present invention, when performing the dual polysilicon gate process of the transistor having a three-dimensional multi-plane channel such as the RCAT, the bulb-type recess channel array transistor, the FinFET, and the saddle FinFET, it is possible to realize a device having a dual polysilicon gate with excellent property in spite of an ion implantation dose of $1E16/cm^2$ or less.

In addition, since the P+ polysilicon uniformly doped with P-type impurity such as boron at every position is used as a gate electrode of the transistor formed in the cell region, it is possible to improve current drive without degradation of an off-leakage characteristic.

While the present invention has been described with respect to the specific embodiments, it will be apparent to those skilled in the art that various changes and modifications may be made without departing from the spirit and scope of the invention as defined in the following claims.

What is claimed is:

1. A method for forming a dual polysilicon gate of a semiconductor device, the method comprising:
   forming a channel region with a recessed structure in a first region of a substrate having the first region and a second region;
   forming a gate insulating layer over the substrate;
   forming a first polysilicon layer over the gate insulating layer;
   forming an insulating layer doped with a first impurity over the first polysilicon layer of the first region, wherein the insulating layer fills the channel region;
   performing a first thermal treatment to diffuse the first impurity of the insulating layer into the first polysilicon layer of the first region;
   removing a predetermined portion of the insulating layer such that a remaining portion of the insulating layer is disposed inside the channel region;
   forming a second polysilicon layer over the remaining portion of the insulating layer and the first polysilicon layer;
   implanting a second impurity into the second polysilicon layer of the second region; and
   performing a second thermal treatment to simultaneously form a polysilicon layer doped with the first impurity in the first region and a polysilicon layer doped with the second impurity in the second region,
   wherein the first impurity in the remaining portion of the insulating layer and the first polysilicon layer is diffused into the second polysilicon layer in the first region while performing the second thermal treatment.

2. The method of claim 1, wherein the first and second polysilicon layers include an undoped polysilicon layer.

3. The method of claim 1, wherein the insulating layer doped with the first impurity includes an insulating layer doped with an N-type impurity; and the second impurity includes a P-type impurity.

4. The method of claim 3, wherein the insulating layer doped with the N-type impurity includes a PSG layer; and the P-type impurity includes boron.

5. The method of claim 4, wherein a phosphorous concentration in the PSG layer is no more than approximately 20%; and a dose of boron is no more than $1E16/cm^2$.

6. The method of claim 1, wherein the insulating layer doped with the first impurity includes an insulating layer doped with a P-type impurity; and the second impurity includes an N-type impurity.

7. The method of claim 6, wherein the insulating layer doped with the P-type impurity includes a BSG layer; and the N-type impurity includes phosphorous.

8. The method of claim 7, wherein a boron concentration in the BSG layer is no more than approximately 20%; and a dose of phosphorous is no more than $1E16/cm^2$.

9. The method of claim 1, wherein the first and second thermal treatments are performed at a temperature ranging from approximately 600° C. to approximately 1,000° C.

10. The method of claim 1, wherein a cell array region where an NMOS is formed and a peripheral circuit region where an NMOS and a PMOS are formed are defined in the substrate,
   the first region corresponding to the peripheral circuit region where the NMOS is formed and the cell array region, and the second region corresponding to the peripheral circuit region where the PMOS is formed.

11. The method of claim 1, wherein a cell array region where an NMOS is formed and a peripheral circuit region where an NMOS and a PMOS are formed are defined in the substrate,
   the first region corresponding to the peripheral circuit region where the PMOS is formed and the cell array region, and the second region corresponding to the peripheral circuit region where the NMOS is formed.

12. The method of claim 1, wherein the channel region comprises a multi-plane channel region, wherein the multi-plane channel region comprises a recessed channel region or the bulb-type recess channel region.

13. A method for forming a dual polysilicon gate of a semiconductor device, the method comprising:
   forming a channel region with a protrusion structure in a first region of a substrate having the first region and a second region;
   forming a gate insulating layer over the substrate;
   forming a first polysilicon layer over the gate insulating layer;
   forming an insulating layer doped with a first impurity over the first polysilicon layer of the first region, wherein the insulating layer encloses the channel region;
   performing a first thermal treatment to diffuse the first impurity of the insulating layer into the first polysilicon layer of the first region;
   removing a predetermined portion of the insulating layer such that a remaining portion of the insulating layer encloses the channel region;
   forming a second polysilicon layer over the remaining portion of the insulating layer and the first polysilicon layer;
   implanting a second impurity into the second polysilicon layer of the second region; and
   performing a second thermal treatment to form a polysilicon layer doped with the first impurity in the first region and a polysilicon layer doped with the second impurity in the second region.

14. The method of claim 13, wherein the first and second polysilicon layers include an undoped polysilicon layer.

15. The method of claim 13, wherein the insulating layer doped with the first impurity includes an insulating layer doped with an N-type impurity; and the second impurity includes a P-type impurity.

16. The method of claim 15, wherein the insulating layer doped with the N-type impurity includes a PSG layer; and the P-type impurity includes boron.

17. The method of claim 16, wherein a phosphorous concentration in the PSG layer is no more than approximately 20%; and a dose of boron is no more than $1E16/cm^2$.

18. The method of claim 13, wherein the insulating layer doped with the first impurity includes an insulating layer doped with a P-type impurity; and the second impurity includes an N-type impurity.

19. The method of claim 18, wherein the insulating layer doped with the P-type impurity includes a BSG layer; and the N-type impurity includes phosphorous.

20. The method of claim 19, wherein a boron concentration in the BSG layer is no more than approximately 20%; and a dose of phosphorous is no more than 1E16/cm$^2$.

21. The method of claim 13, wherein the first and second thermal treatments are performed at a temperature ranging from approximately 600° C. to approximately 1,000° C.

22. The method of claim 13, wherein a cell array region where an NMOS is formed and a peripheral circuit region where an NMOS and a PMOS are formed are defined in the substrate, the first region corresponding to the peripheral circuit region where the NMOS is formed and the cell array region, and the second region corresponding to the peripheral circuit region where the PMOS is formed.

23. The method of claim 13, wherein a cell array region where an NMOS is formed and a peripheral circuit region where an NMOS and a PMOS are formed are defined in the substrate, the first region corresponding to the peripheral circuit region where the PMOS is formed and the cell array region, and the second region corresponding to the peripheral circuit region where the NMOS is formed.

24. The method of claim 13, wherein the channel region comprises a multi-plane channel region, wherein the multi-plane channel region comprises a fin shaped channel region or a saddle-fin shaped channel region.

* * * * *